(12) United States Patent
Gorobets

(10) Patent No.: US 7,631,162 B2
(45) Date of Patent: *Dec. 8, 2009

(54) NON-VOLATILE MEMORY WITH ADAPTIVE HANDLING OF DATA WRITES

(75) Inventor: Sergey Anatolievich Gorobets, Edinburgh (GB)

(73) Assignee: SanDisk Corporation, Milpitas, CA (US)

( * ) Notice: Subject to any disclaimer, the term of this patent is extended or adjusted under 35 U.S.C. 154(b) by 80 days.

This patent is subject to a terminal disclaimer.

(21) Appl. No.: 11/261,150

(22) Filed: Oct. 27, 2005

(65) Prior Publication Data

US 2007/0101096 A1    May 3, 2007

(51) Int. Cl.
G06F 9/26 (2006.01)
G06F 9/34 (2006.01)
G06F 13/00 (2006.01)
G06F 13/28 (2006.01)

(52) U.S. Cl. .................. 711/203; 711/202; 711/103

(58) Field of Classification Search ............... None
See application file for complete search history.

(56) References Cited

U.S. PATENT DOCUMENTS

| | | |
|---|---|---|
| 5,043,940 A | 8/1991 | Harari |
| 5,070,032 A | 12/1991 | Yuan et al. |
| 5,095,344 A | 3/1992 | Harari |
| 5,172,338 A | 12/1992 | Mehrotra et al. |
| 5,274,646 A | 12/1993 | Brey et al. |
| 5,313,421 A | 5/1994 | Guterman et al. |
| 5,315,541 A | 5/1994 | Harari et al. |
| 5,343,063 A | 8/1994 | Yuan et al. |
| 5,367,484 A | 11/1994 | Alexander et al. |
| 5,404,485 A | 4/1995 | Ban |
| 5,428,621 A | 6/1995 | Mehrotra et al. |
| 5,465,235 A | 11/1995 | Miyamoto |
| 5,532,962 A | 7/1996 | Auclair et al. |
| 5,570,315 A | 10/1996 | Tanaka et al. |
| 5,572,466 A | 11/1996 | Sukegawa |

(Continued)

FOREIGN PATENT DOCUMENTS

EP    0 757 317 A    2/1997

(Continued)

OTHER PUBLICATIONS

Nakamura et al., "A Novel Sense. Amplifier. for Flexible Voltage Operation NAND Flash Memories," 1995 *Symposium on VLSI Circuits Digest of Technical Papers*, Jun. 8-10, 1995, pp. 71-72.

(Continued)

*Primary Examiner*—Kevin Verbrugge
*Assistant Examiner*—Eric S Cardwell
(74) *Attorney, Agent, or Firm*—Davis Wright Tremaine LLP

(57) ABSTRACT

A memory system is presented where sectors are normally stored in logically contiguous groups. As repeated writes of the same small sector group can causes a massive garbage collection (data relocation), the pattern of host access is monitored by checking the sectors' update history and control data structures' update history. When repeated access patterns are detected and then expected again, the "hot" segments are separated into specially handled, non-standard zone in the memory. The non-standard zone has a sector management that is different from the logical groups and optimized for the repeated host accesses in order to reduce the frequency and amount of garbage collection operations.

10 Claims, 14 Drawing Sheets

U.S. PATENT DOCUMENTS

| | | | |
|---|---|---|---|
| 5,661,053 | A | 8/1997 | Yuan |
| 5,734,816 | A | 3/1998 | Niijima et al. |
| 5,742,934 | A | 4/1998 | Shinohara |
| 5,751,634 | A | 5/1998 | Itoh |
| 5,768,192 | A | 6/1998 | Eitan |
| 5,774,397 | A | 6/1998 | Endoh et al. |
| 5,798,968 | A | 8/1998 | Lee et al. |
| 5,822,245 | A | 10/1998 | Gupta et al. |
| 5,845,313 | A | 12/1998 | Estakhri et al. |
| 5,860,124 | A | 1/1999 | Matthews et al. |
| 5,890,192 | A | 3/1999 | Lee et al. |
| 5,903,495 | A | 5/1999 | Takeuchi et al. |
| 5,907,856 | A | 5/1999 | Estakhri et al. |
| 5,909,449 | A | 6/1999 | So et al. |
| 5,930,167 | A | 7/1999 | Lee et al. |
| 5,937,425 | A | 8/1999 | Ban |
| 6,011,725 | A | 1/2000 | Eitan |
| 6,021,463 | A | 2/2000 | Belser |
| 6,034,897 | A | 3/2000 | Estakhri et al. |
| 6,040,997 | A | 3/2000 | Estakhri |
| 6,046,935 | A | 4/2000 | Takeuchi et al. |
| 6,125,435 | A | 9/2000 | Estakhri et al. |
| 6,141,249 | A | 10/2000 | Estakhri et al. |
| 6,222,762 | B1 | 4/2001 | Guterman et al. |
| 6,266,273 | B1 | 7/2001 | Conley et al. |
| 6,272,610 | B1 | 8/2001 | Katayama et al. |
| 6,282,624 | B1 | 8/2001 | Kimura et al. |
| 6,317,371 | B2 | 11/2001 | Katayama et al. |
| 6,374,337 | B1 | 4/2002 | Estakhri |
| 6,377,500 | B1 | 4/2002 | Fujimoto et al. |
| 6,388,920 | B2 | 5/2002 | Katayama et al. |
| 6,421,279 | B1 | 7/2002 | Tobita et al. |
| 6,426,893 | B1 | 7/2002 | Conley et al. |
| 6,449,625 | B1 | 9/2002 | Wang |
| 6,456,528 | B1 | 9/2002 | Chen |
| 6,490,649 | B2 | 12/2002 | Sinclair |
| 6,522,580 | B2 | 2/2003 | Chen et al. |
| 6,522,586 | B2 | 2/2003 | Wong |
| 6,525,952 | B2 | 2/2003 | Araki et al. |
| 6,563,734 | B2 | 5/2003 | Taki |
| 6,567,307 | B1 | 5/2003 | Estakhri |
| 6,574,705 | B1 | 6/2003 | Peloquin et al. |
| 6,581,132 | B1 | 6/2003 | Kakinuma et al. |
| 6,581,142 | B1 | 6/2003 | Jacobs |
| 6,591,329 | B1 | 7/2003 | Kakinuma et al. |
| 6,591,330 | B2 | 7/2003 | Lasser |
| 6,725,321 | B1 | 4/2004 | Sinclair et al. |
| 6,763,424 | B2 | 7/2004 | Conley |
| 6,895,464 | B2 | 5/2005 | Chow et al. |
| 6,898,662 | B2 | 5/2005 | Gorobets |
| 2002/0099904 | A1 | 7/2002 | Conley |
| 2003/0053334 | A1 | 3/2003 | Chen |
| 2003/0065899 | A1 | 4/2003 | Gorobets |
| 2003/0070036 | A1 | 4/2003 | Gorobets |
| 2003/0099134 | A1 | 5/2003 | Lasser et al. |
| 2003/0109093 | A1 | 6/2003 | Harari et al. |
| 2003/0110343 | A1 | 6/2003 | Hagiwara et al. |
| 2003/0202377 | A1 | 10/2003 | Harari et al. |
| 2003/0227804 | A1* | 12/2003 | Lofgren et al. ............... 365/200 |
| 2004/0111553 | A1 | 6/2004 | Conley |
| 2005/0073884 | A1 | 4/2005 | Gonzalez et al. |
| 2005/0141312 | A1 | 6/2005 | Sinclair et al. |
| 2005/0141313 | A1 | 6/2005 | Gorobets et al. |
| 2005/0144360 | A1 | 6/2005 | Bennett et al. |
| 2005/0144363 | A1 | 6/2005 | Sinclair |
| 2005/0144365 | A1 | 6/2005 | Gorobets et al. |
| 2005/0166087 | A1 | 7/2005 | Gorobets |

FOREIGN PATENT DOCUMENTS

| | | |
|---|---|---|
| EP | 887732 | 12/1998 |
| EP | 0977121 A2 | 2/2000 |
| EP | 1424631 A | 6/2004 |
| EP | 1 548 599 A | 6/2005 |
| JP | 5282883 | 10/1993 |
| JP | 5314019 | 11/1993 |
| JP | 11003290 | 11/1999 |
| WO | WO 00/49488 | 8/2000 |
| WO | WO 00/67137 | 11/2000 |
| WO | WO 02/49039 A2 | 6/2002 |
| WO | WO 02/058074 | 7/2002 |
| WO | WO 03/027828 | 4/2003 |
| WO | WO 03/029951 A2 | 4/2003 |
| WO | WO 03/069627 | 8/2003 |
| WO | 2004/040457 | 5/2004 |
| WO | 2004/040458 | 5/2004 |
| WO | 2004/040459 | 5/2004 |
| WO | 2004/040578 | 5/2004 |

OTHER PUBLICATIONS

Srisa-an et al., "Performance Enhancements to the Active Memory System," *2002 IEEE International Conference on Computer Design: VLSI in Computers and Processors*, Sep. 16-18, 2002, pp. 249- 256.

Lee et al., "High-Performance 1-Gb NAND Flash Memory.with 0.12-µm Technology," *Journal of Solid-State Circuits*, Nov. 2002, vol. 37, No. 11, pp. 1502-1509.

Imamiya et al., "A 125-mm$^2$ 1-Gb NAND Flash Memory with 10/Mbyte/s Program Speed," *IEEE Journal of Solid State Circuits*, vol. 37, No. 11, Nov. 2002, pp. 1493-1501.

Eitan et al., "NROM: A Novel Localized Trapping, 2-Bit Nonvolatile Memory Cell;" IEE Electron Device Letters, vol. 21, No. 1, Nov. 2000,. pp. 543-545.

Chang, Li-Pin et al., "An Adaptive Striping Architecture for Flash Memory Storage Systems of Embedded Systems", Proceedings of the Eighth IEEE Real-Time and Embedded Technology and Applications Symposium, Sep. 24, 2002, pp. 187-196.

EPO/ISA, "Notification of Transmittal of the International Search Report and the Written Opinion of the Internation Searching Authority, or the Declaration," mailed in related International Patent Aplication No. PCT/US2007/060080 on Aug. 17, 2007, 12 pages.

USPTO, "Office Action," mailed in related U.S. Appl. No. 11/261,138 on Sep. 21, 2007, 12 pages.

Office Action for U.S. Appl. No. 11/261,138, filed Jul. 2, 2008, 15 pages.

* cited by examiner

SEQUENTIAL UPDATE Example

CHAOTIC UPDATE (NONSEQUENTIAL) Example

Chaotic Block Index (CBI) Sector

| Chaotic Block Index | Chaotic Block Info | CBI Sector Index |
|---|---|---|

NON-VOLATILE MEMORY WITH ADAPTIVE HANDLING OF DATA WRITES

RELATED APPLICATIONS

The present application is related to U.S. application Ser. No. 11/261,138, of Gorobets, entitled "Non-Volatile Memory with Adaptive Handling of Data Writes," filed on Oct. 27, 2005, now U.S. Pat. No. 7,509,471, which is hereby incorporated herein, in its entirety, by this reference.

BACKGROUND OF THE INVENTION

This invention pertains generally to the field of semiconductor non-volatile data storage system architectures and their methods of operation and, more specifically, to the management of data structures in such memories.

A common application of flash EEPROM devices is as a mass data storage subsystem for electronic devices. Such subsystems are commonly implemented as either removable memory cards that can be inserted into multiple host systems or as non-removable embedded storage within the host system. In both implementations, the subsystem includes one or more flash devices and often a subsystem controller.

Flash EEPROM devices are composed of one or more arrays of transistor cells, each cell capable of non-volatile storage of one or more bits of data. Thus flash memory does not require power to retain the data programmed therein. Once programmed however, a cell must be erased before it can be reprogrammed with a new data value. These arrays of cells are partitioned into groups to provide for efficient implementation of read, program and erase functions. A typical flash memory architecture for mass storage arranges large groups of cells into erasable blocks, wherein a block contains the smallest number of cells (unit of erase) that are erasable at one time.

In one commercial form, each block contains enough cells to store one sector of user data plus some overhead data related to the user data and/or to the block in which it is stored. The amount of user data included in a sector is the standard 512 bytes in one class of such memory systems but can be of some other size. Because the isolation of individual blocks of cells from one another that is required to make them individually erasable takes space on the integrated circuit chip, another class of flash memories makes the blocks significantly larger so there is less space required for such isolation. But since it is also desired to handle user data in much smaller sectors, each large block is often further partitioned into individually addressable ages that are the basic unit for reading and programming user data. Each page usually stores one sector of user data, but a page may store a partial sector or multiple sectors. A "sector" is used herein to refer to an amount of user data that is transferred to and from the host as a unit.

The subsystem controller in a large block system performs a number of functions including the translation between logical addresses received by the memory sub-system from a host, and physical addresses within the memory cell array. This translation often involves use of intermediate terms for a logical block number (LBN) and logical page. The controller also manages the low-level flash circuit operation through a series of commands that it issues to the flash memory devices via an interface bus. Another function the controller performs is to maintain the integrity of data stored to the subsystem through various means, such as by using an error correction code (ECC).

Data from the host is typically just provided to the memory system identified as logical sectors. For example, the host will send data described in terms of a starting logical sector and the total number of sectors. Within the host, these logical sectors may be structured into larger units, but this information is typically not passed on to the memory's controller. (Knowledge of these host structures can be used, though, to have physical structures in the memory or controller constructs reflect these host structures as they will reflect how the host transfers data: for example, memories are typically structured to store user data based on a physical sector that is the same size as a logical sector.) The controller organizes the host structures into logical constructs that mimic the physical structure for more efficient storage of them in the physical memory. For example, in a common arrangement the memory system controller groups logical sectors (as defined by the host) into logical blocks that correspond in size to the physical structure of a block, which is the physical unit of erase for a flash type memory. The controller can then maintain the relation of the physical structures to the logical constructs, for instance in the form of a Sector Address Table (SAT), and updated this correspondence as the logical to physical relation changes.

For greater efficiency, memory systems often increase parallelism by introducing larger structures. For instance, in memory system having a number of semi-autonomous arrays that can be written, read, or both, concurrently, blocks from different arrays are grouped into "meta-block" structures and the controller will form logical blocks of data into corresponding logical meta-blocks, allowing for the multiple blocks to be operated upon at the same time. This arrangement is beneficial for sequential read and writes of logically contiguous sectors of relatively large amounts of data. It has a number of negative effects, though, when there is need to manipulate data of a finer granularity as the system must work with the larger structures. For example, if the host repeatedly reads and writes a single logical sector, the entire meta-block will be repeatedly read and written due only the single "hot" sector, resulting in all of the overhead and time latencies from the large data structures being deposited upon this single sector. Consequently, flash and other memory system would benefit greatly from techniques that allow them to use large data structures, and the resultant efficiency gained from increased parallelism, for large amounts of logically contiguous sectors of data, while also allowing smaller data structures to be readily accessed.

SUMMARY OF THE INVENTION

According to a principle aspect of the present invention, in a memory system where the sectors are normally stored in logically contiguous groups, and repeated writes of the same small sector group causes a massive garbage collection (data relocation) the pattern of host access is monitored by checking the sectors' update history and control data structures' update history. When repeated access patterns are detected and then expected again, the "hot" segments are separated into specially handled, non-standard zone in the memory. The non-standard zone has a sector management that is different from the logical groups and optimized for the repeated host accesses in order to reduce the frequency and amount of garbage collection operations. The non-standard zone can be reassigned back into normal logical group form. When new "hot" areas appear new non-standard zone are organized. The logical location and size of the non-standard zones can closely match the "hot" segments. The number of such non-standard zones is limited by the volume of spare capacity on the card as it is assumed that the non-standard zones are less compact than the logically grouped data blocks.

Among other advantages, the present invention reduces sector access time and garbage collection time when host accesses small logical areas of the card repeatedly and the size, number and location of those small logical areas are not predictable.

Additional aspects, features and advantages of the present invention are included in the following description of exemplary embodiments, which description should be read in conjunction with the accompanying drawings.

DESCRIPTION OF EXEMPLARY EMBODIMENTS OF THE INVENTION

As in the Background and the referenced cited there, for mass data storage performance can be improved through increased parallelism, including the formation of larger logical structures, such as meta-blocks, from the underlying physical structures of the memory. Such structures are described in more detail in U.S. patent application Ser. Nos. 10/750,155, filed Dec. 30, 2003; 10/917,888, 10/917,867, 10/917,889, and 10/917,725, all filed Aug. 13, 2004; 10/750, 157, filed Dec. 30, 2003; and 10/846,289, filed May 13, 2004, which are hereby incorporated by reference. However, when a host accesses a small logical area, such as a sector or a collection of a small number of sectors, of the card repeatedly and the size, number and location of those small logical areas are not predictable, the controller is faced with a large amount of data relocation, or "garbage collection", and long access time latencies. Various techniques for handling the smaller data portions can be found, for example, in U.S. patent application Ser. No. 10/749,189, filed Dec. 30, 2003, which is also hereby incorporated by reference. The main aspects of the present invention are the detection and maintenance frequently assessed smaller logical units. The following discussion begins with the presentation of an exemplary memory arrangement to provide context for the subsequent discussion of the principle aspects of the present invention. The following presentation is based on that of U.S. patent application Ser. No. 10/750,155 and is developed in more detail there. This discussion could alternately be based on any number of exemplary memory systems, such as the cyclic storage arrangement of international patent document WO 2003/0065899, which is hereby incorporated by reference.

Exemplary Non-Volatile Memory Structures

Figure 1:
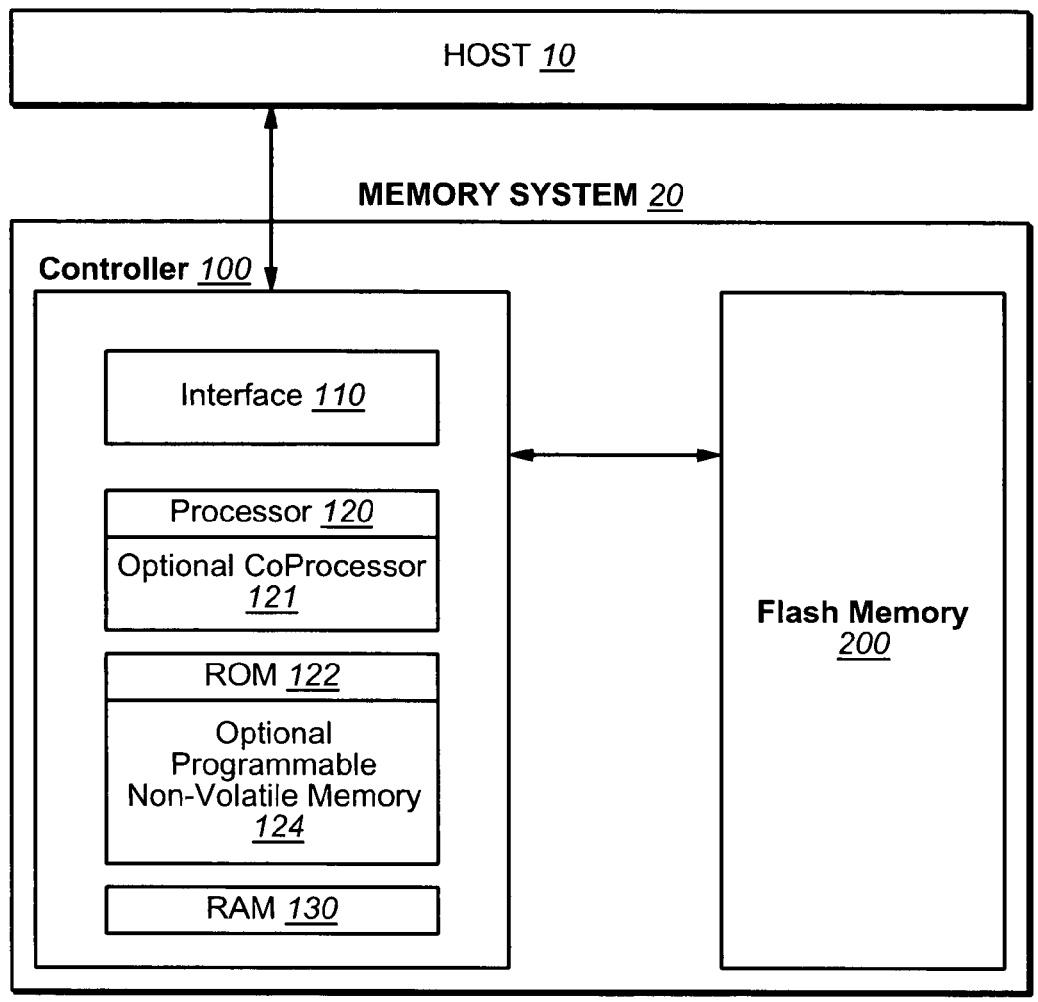
FIG. 1 illustrates schematically the main hardware components of a memory system suitable for implementing the present invention.

FIG. 1 illustrates schematically the main hardware components of a memory system suitable for implementing the present invention. The memory system 20 typically operates with a host 10 through a host interface. The memory system is typically in the form of a memory card or an embedded memory system. The memory system 20 includes a memory 200 whose operations are controlled by a controller 100. The memory 200 comprises of one or more array of non-volatile memory cells distributed over one or more integrated circuit chip. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 200. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

A number of architectures are used for non-volatile memories arrays of Flash Memory 20. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents and pending applications of SanDisk Corporation that are incorporated herein in their entirety by this reference: U.S. Pat. Nos. 5,095, 344, 5,172,338, 5,602,987, 5,663,901, 5,430,859, 5,657,332, 5,712,180, 5,890,192, 6,151,248, 6,426,893, and 6,512,263.

A NAND array of one design has a number of memory cells, such as 8, 16 or even 32, connected in series string between a bit line and a reference potential through select transistors at either end. Word lines are connected with control gates of cells in different series strings. Relevant examples of such arrays and their operation are given in the following U.S. patent application Ser. No. 6,522,580, that is also hereby incorporated by reference, and references contained therein. See also U.S. Pat. No. 6,771,536 and application Ser. Nos. 10/254,483, filed Sep. 24, 2002, and 10/665, 828, filed Sep. 17, 2003, which are also hereby incorporated by reference.

Figure 2:
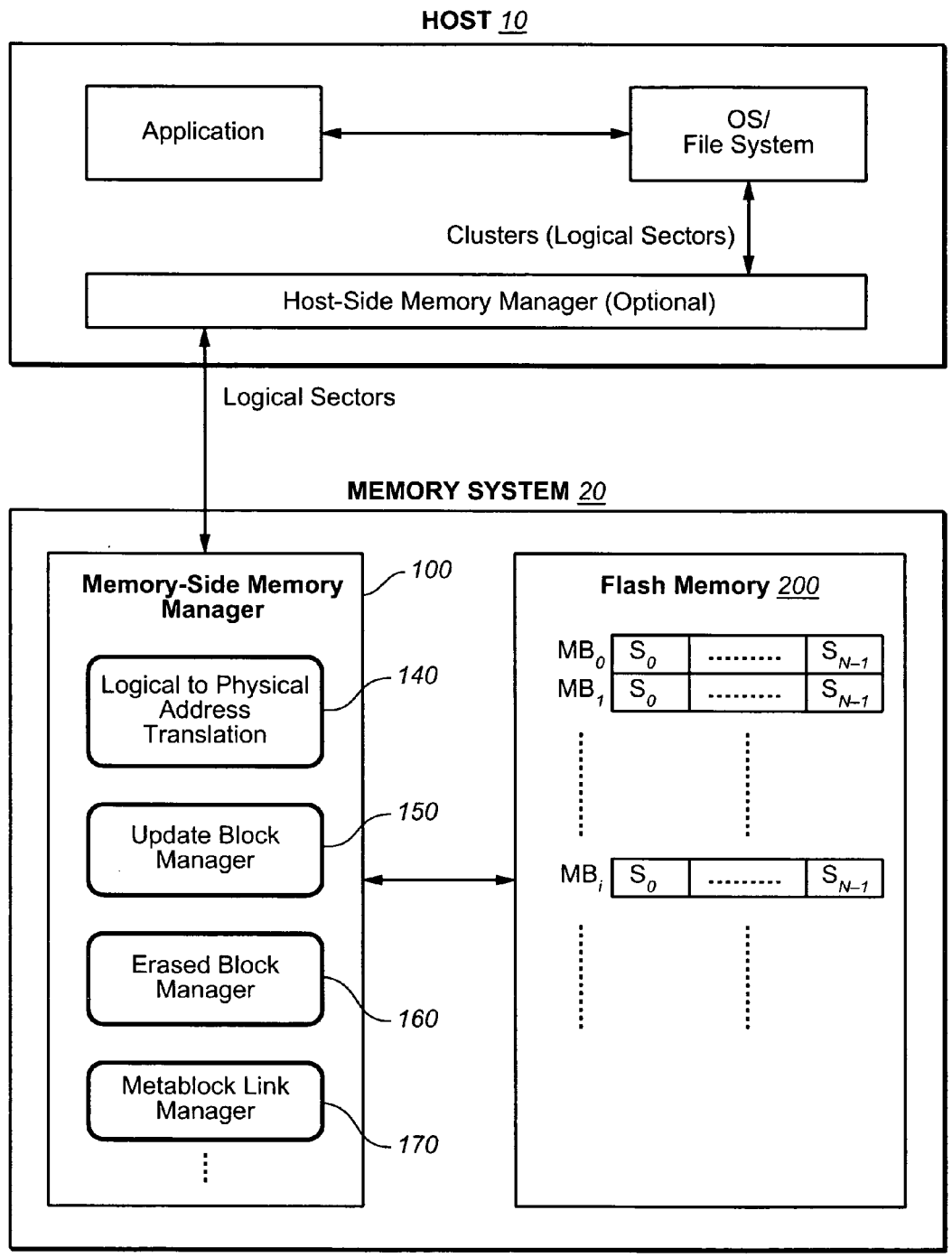
FIG. 2 illustrates the memory being organized into physical groups of sectors (or metablocks) and managed by a memory manager of the controller, according to a preferred embodiment of the invention.

FIG. 2 illustrates the memory being organized into physical groups of sectors (or metablocks) and managed by a memory manager of the controller, according to a preferred embodiment of the invention. The memory 200 is organized into metablocks, where each metablock is a group of physical sectors $S_0, \ldots, S_{N-1}$ that are erasable together.

The host 10 accesses the memory 200 when running an application under a file system or operating system. Typically, the host system addresses data in units of logical sectors where, for example, each sector may contain 512 bytes of data. Also, it is usual for the host to read or write to the memory system in unit of logical clusters, each consisting of one or more logical sectors. In some host systems, an optional host-side memory manager may exist to perform lower level memory management at the host. In most cases during read or write operations, the host 10 essentially issues a command to the memory system 20 to read or write a segment containing a string of logical sectors of data with contiguous addresses.

A memory-side memory manager is implemented in the controller 100 of the memory system 20 to manage the storage and retrieval of the data of host logical sectors among metablocks of the flash memory 200. In the preferred embodiment, the memory manager contains a number of software modules for managing erase, read and write operations of the metablocks. The memory manager also maintains system control and directory data associated with its operations among the flash memory 200 and the controller RAM 130.

Figure 3A:
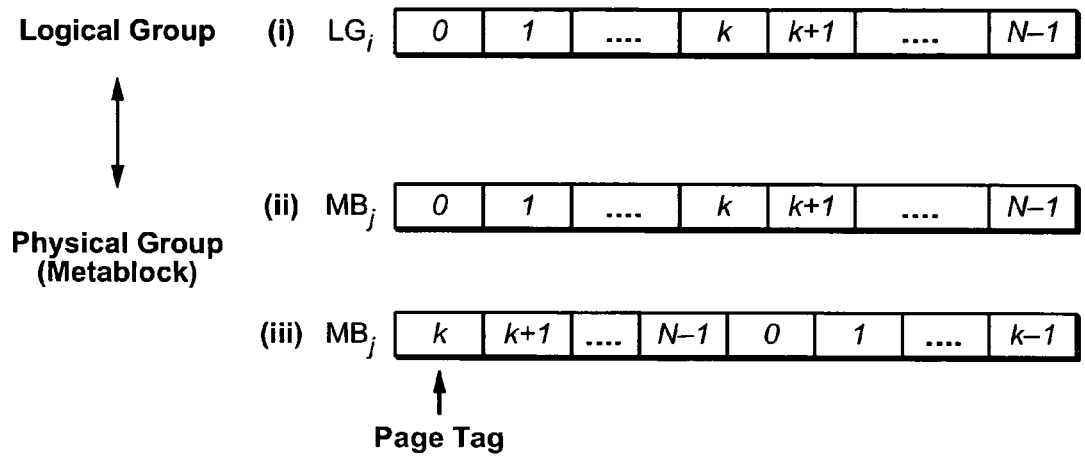
FIGS. 3A(i)-3A(iii) illustrate schematically the mapping between a logical group and a metablock, according to a preferred embodiment of the present invention.

FIGS. 3A(i)-3A(iii) illustrate schematically the mapping between a logical group and a metablock, according to a preferred embodiment of the present invention. The metablock of the physical memory has N physical sectors for storing N logical sectors of data of a logical group. FIG. 3A(i) shows the data from a logical group $LG_i$, where the logical sectors are in contiguous logical order 0, 1, . . . , N−1. FIG. 3A(ii) shows the same data being stored in the metablock in the same logical order. The metablock when stored in this manner is said to be "sequential." In general, the metablock may have data stored in a different order, in which case the metablock is said to be "non-sequential" or "chaotic."

There may be an offset between the lowest address of a logical group and the lowest address of the metablock to which it is mapped. In this case, logical sector address wraps round as a loop from bottom back to top of the logical group within the metablock. For example, in FIG. 3A(iii), the metablock stores in its first location beginning with the data of logical sector k. When the last logical sector N−1 is reached, it wraps around to sector 0 and finally storing data associated with logical sector k−1 in its last physical sector. In the preferred embodiment, a page tag is used to identify any offset, such as identifying the starting logical sector address of the data stored in the first physical sector of the metablock. Two blocks will be considered to have their logical sectors stored in similar order when they only differ by a page tag.

Figure 3B:
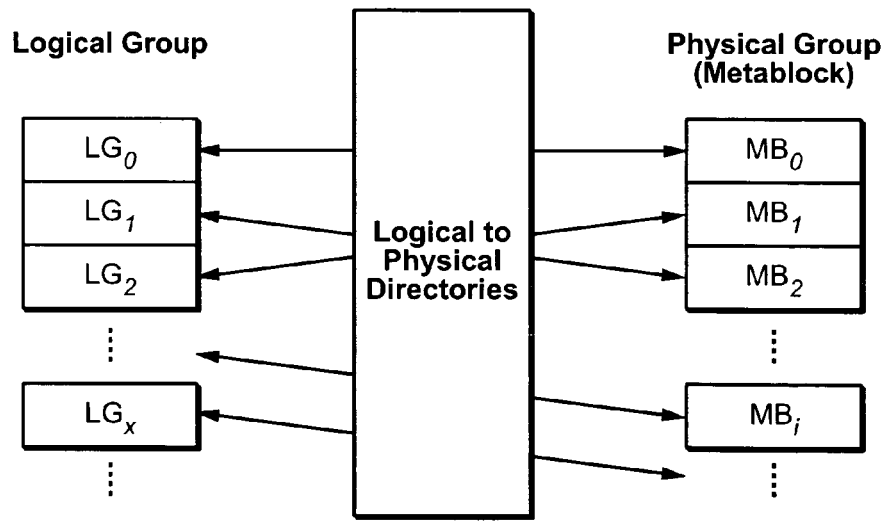
FIG. 3B illustrates schematically the mapping between logical groups and metablocks.

FIG. 3B illustrates schematically the mapping between logical groups and metablocks. Each logical group is mapped to a unique metablock, except for a small number of logical groups in which data is currently being updated. After a logical group has been updated, it may be mapped to a different metablock. The mapping information is maintained in a set of logical to physical directories, which will be described in more detail later.

Other types of logical group to metablock mapping are also contemplated. For example, metablocks with variable size are disclosed in co-pending and co-owned Ser. No. 10/750,157. The entire disclosure of the co-pending application is hereby incorporated herein by reference.

One feature of the invention is that the system operates with a single logical partition, and groups of logical sectors throughout the logical address range of the memory system are treated identically. For example, sectors containing system data and sectors containing user data can be distributed anywhere among the logical address space.

Unlike prior art systems, there is no special partitioning or zoning of system sectors (i.e., sectors relating to file allocation tables, directories or sub-directories) in order to localize in logical address space sectors that are likely to contain data with high-frequency and small-size updates. Instead, the present scheme of updating logical groups of sectors will efficiently handle the patterns of access that are typical of system sectors, as well as those typical of file data.

Figure 4:
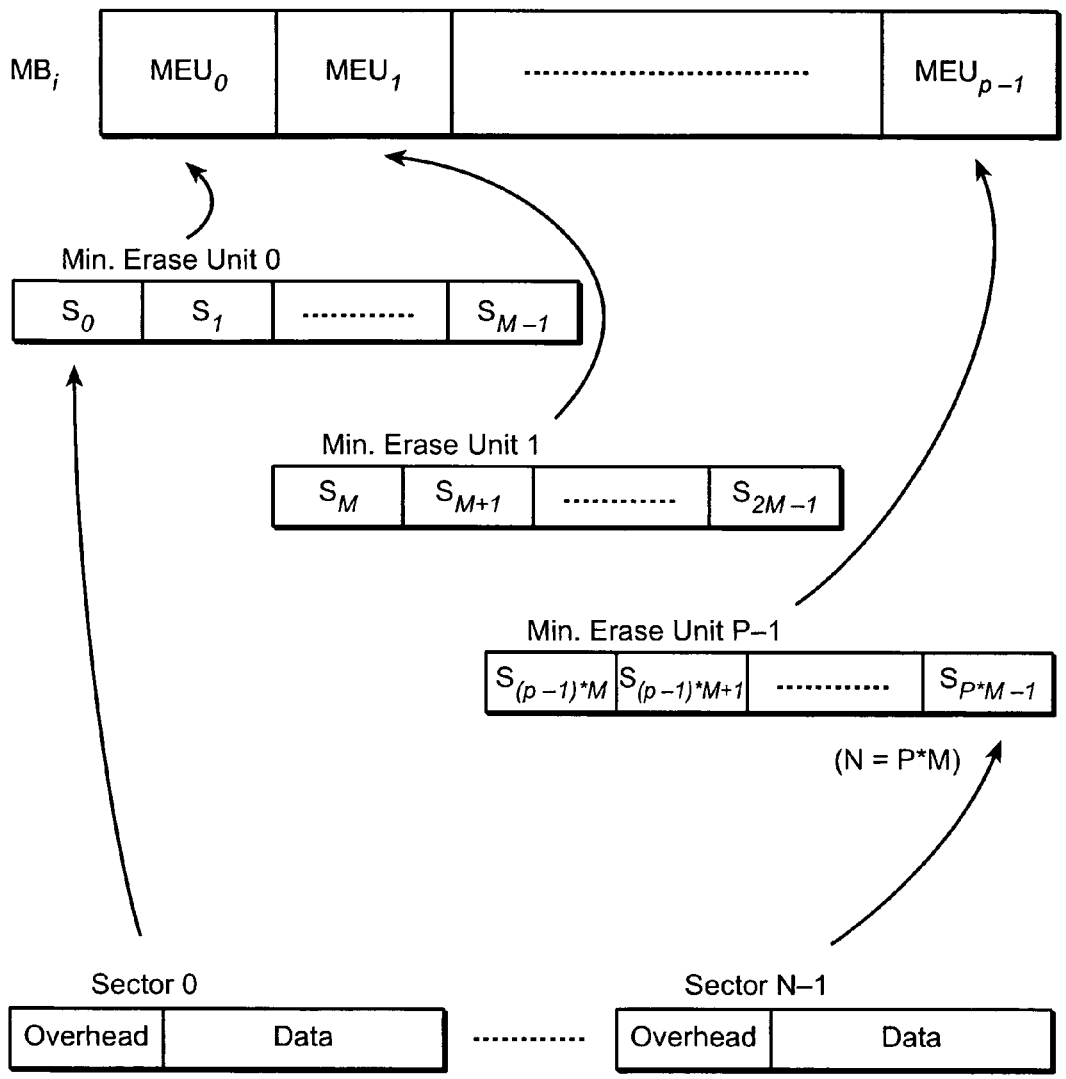
FIG. 4 illustrates the alignment of a metablock with structures in physical memory.

FIG. 4 illustrates the alignment of a metablock with structures in physical memory. Flash memory comprises blocks of memory cells which are erasable together as a unit. Such erase blocks are the minimum unit of erasure of flash memory or minimum erasable unit (MEU) of the memory. The minimum erase unit is a hardware design parameter of the memory, although in some memory systems that supports multiple MEUs erase, it is possible to configure a "super MEU" comprising more than one MEU. For flash EEPROM, a MEU may comprise one sector but preferably multiple sectors. In the example shown, it has M sectors. In the preferred embodiment, each sector can store 512 bytes of data and has a user data portion and a header portion for storing system or overhead data. If the metablock is constituted from P MEUs, and each MEU contains M sectors, then, each metablock will have N=P*M sectors.

The metablock represents, at the system level, a group of memory locations, e.g., sectors that are erasable together. The physical address space of the flash memory is treated as a set of metablocks, with a metablock being the minimum unit of erasure. Within this specification, the terms "metablock" and "block" are used synonymously to define the minimum unit of erasure at the system level for media management, and the term "minimum erase unit" or MEU is used to denote the minimum unit of erasure of flash memory.

In order to maximize programming speed and erase speed, parallelism is exploited as much as possible by arranging for multiple pages of information, located in multiple MEUs, to be programmed in parallel, and for multiple MEUs to be erased in parallel.

In flash memory, a page is a grouping of memory cells that may be programmed together in a single operation. A page may comprise one or more sector. Also, a memory array may be partitioned into more than one plane, where only one MEU within a plane may be programmed or erased at a time. Finally, the planes may be distributed among one or more memory chips.

In flash memory, the MEUs may comprise one or more page. MEUs within a flash memory chip may be organized in planes. Since one MEU from each plane may be programmed or erased concurrently, it is expedient to form a multiple MEU metablock by selecting one MEU from each plane (see FIG. 5B below.)

Figures 5A, 5B, 5C:
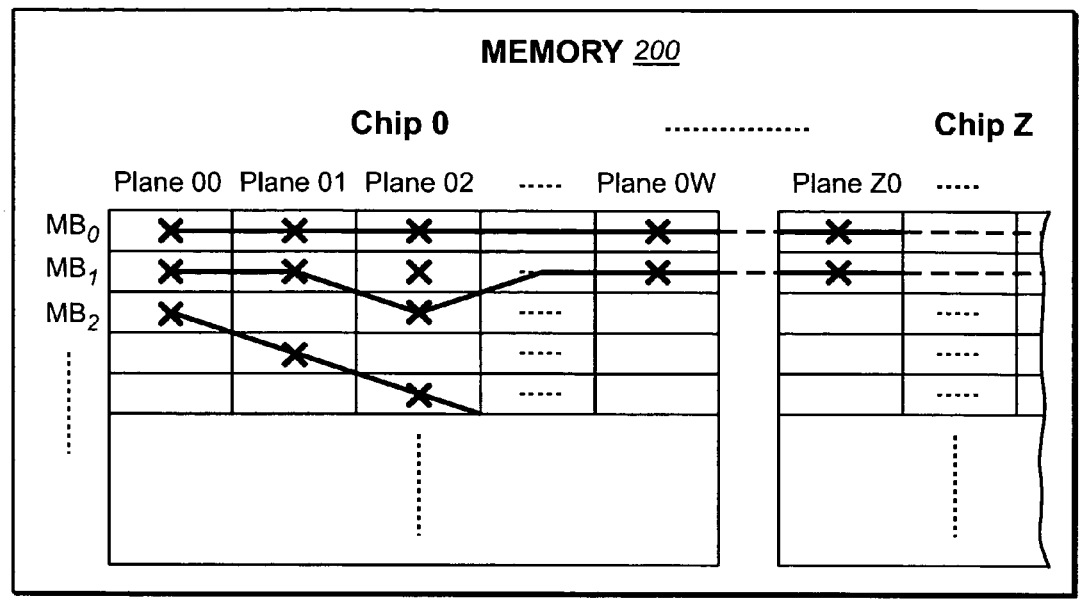
FIG. 5A illustrates metablocks being constituted from linking of minimum erase units of different planes.
FIG. 5B illustrates one embodiment in which one minimum erase unit (MEU) is selected from each plane for linking into a metablock.
FIG. 5C illustrates another embodiment in which more than one MEU are selected from each plane for linking into a metablock.

FIG. 5A illustrates metablocks being constituted from linking of minimum erase units of different planes. Each metablock, such as MB0, MB1, . . . , is constituted from MEUs from different planes of the memory system, where the different planes may be distributed among one or more chips. The metablock link manager 170 shown in FIG. 2 manages the linking of the MEUs for each metablock. Each metablock is configured during an initial formatting process, and retains its constituent MEUs throughout the life of the system, unless there is a failure of one of the MEUs.

FIG. 5B illustrates one embodiment in which one minimum erase unit (MEU) is selected from each plane for linking into a metablock.

FIG. 5C illustrates another embodiment in which more than one MEU are selected from each plane for linking into a metablock. In another embodiment, more than one MEU may be selected from each plane to form a super MEU. For example, a super MEU may be formed from two MEUs. In this case, it may take more than one pass for read or write operation.

The linking and re-linking of MEUs into metablocks is also disclosed in co-pending and co-owned U.S. patent application Ser. No. 10/750,157. The entire disclosure of the co-pending application is hereby incorporated herein by reference.

Figure 6:
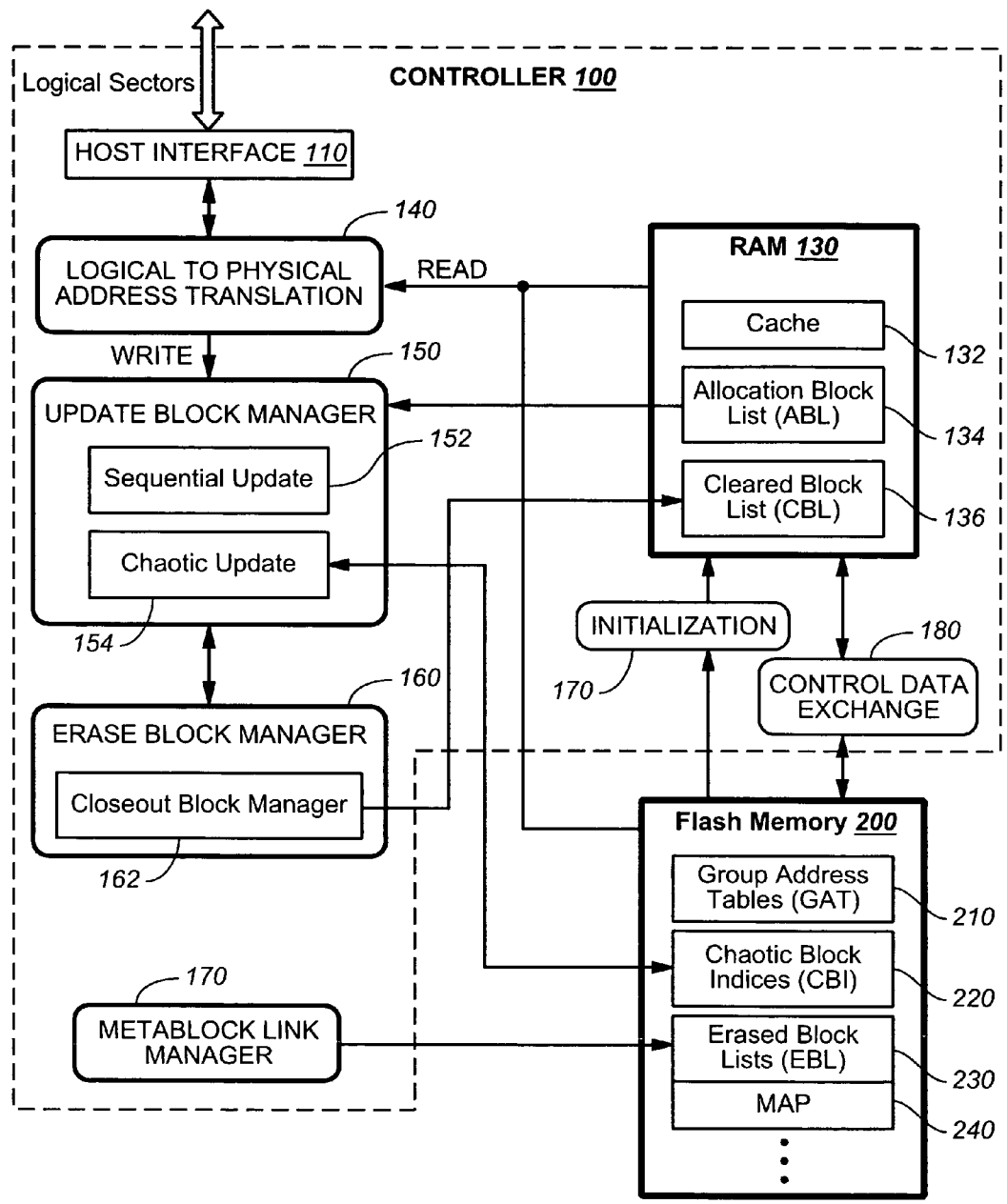
FIG. 6 is a schematic block diagram of the metablock management system as implemented in the controller and flash memory.

FIG. 6 is a schematic block diagram of the metablock management system as implemented in the controller and flash memory. The metablock management system comprises various functional modules implemented in the controller 100 and maintains various control data (including directory data) in tables and lists hierarchically distributed in the flash memory 200 and the controller RAM 130. The function modules implemented in the controller 100 includes an interface module 110, a logical-to-physical address translation module 140, an update block manager module 150, an erase block manager module 160 and a metablock link manager 170.

The interface 110 allows the metablock management system to interface with a host system. The logical to physical address translation module 140 maps the logical address from the host to a physical memory location. The update block Manager module 150 manages data update operations in memory for a given logical group of data. The erased block manager 160 manages the erase operation of the metablocks and their allocation for storage of new information. A metablock link manager 170 manages the linking of subgroups of minimum erasable blocks of sectors to constitute a given metablock. Detailed description of these modules will be given in their respective sections.

During operation the metablock management system generates and works with control data such as addresses, control and status information. Since much of the control data tends to be frequently changing data of small size, it can not be readily stored and maintained efficiently in a flash memory with a large block structure. A hierarchical and distributed scheme is employed to store the more static control data in the nonvolatile flash memory while locating the smaller amount of the more varying control data in controller RAM for more efficient update and access. In the event of a power shutdown or failure, the scheme allows the control data in the volatile controller RAM to be rebuilt quickly by scanning a small set of control data in the nonvolatile memory. This is possible because the invention restricts the number of blocks associated with the possible activity of a given logical group of data. In this way, the scanning is confined. In addition, some of the control data that requires persistence are stored in a nonvolatile metablock that can be updated sector-by-sector, with each update resulting in a new sector being recorded that supercedes a previous one. A sector indexing scheme is employed for control data to keep track of the sector-by-sector updates in a metablock.

The non-volatile flash memory 200 stores the bulk of control data that are relatively static. This includes group address tables (GAT) 210, chaotic block indices (CBI) 220, erased block lists (EBL) 230 and MAP 240. The GAT 210 keeps track of the mapping between logical groups of sectors and their corresponding metablocks. The mappings do not change except for those undergoing updates. The CBI 220 keeps track of the mapping of logically non-sequential sectors during an update. The EBL 230 keeps track of the pool of metablocks that have been erased. MAP 240 is a bitmap showing the erase status of all metablocks in the flash memory.

The volatile controller RAM 130 stores a small portion of control data that are frequently changing and accessed. This includes an allocation block list (ABL) 134 and a cleared block list (CBL) 136. The ABL 134 keeps track of the allocation of metablocks for recording update data while the CBL 136 keeps track of metablocks that have been deallocated and erased. In the preferred embodiment, the RAM 130 acts as a cache for control data stored in flash memory 200.

The update block manager 150 (shown in FIGS. 2 and 6) handles the update of logical groups. According to one aspect of the invention, each logical group of sectors undergoing an update is allocated a dedicated update metablock for recording the update data. In the preferred embodiment, any segment of one or more sectors of the logical group will be recorded in the update block. An update block can be managed to receive updated data in either sequential order or non-sequential (also known as chaotic) order. A chaotic update block allows sector data to be updated in any order within a logical group, and with any repetition of individual sectors. In particular, a sequential update block can become a chaotic update block, without need for relocation of any data sectors. No predetermined allocation of blocks for chaotic data update is required; a non-sequential write at any logical address is automatically accommodated. Thus, unlike prior art systems, there is no special treatment whether the various update segments of the logical group is in logical sequential or non-sequential order. The generic update block will simply be used to record the various segments in the order they are requested by the host. For example, even if host system data or system control data tends to be updated in chaotic fashion, regions of logical address space corresponding to host system data do not need to be treated differently from regions with host user data.

Data of a complete logical group of sectors is preferably stored in logically sequential order in a single metablock. In this way, the index to the stored logical sectors is predefined. When the metablock has in store all the sectors of a given logical group in a predefined order it is said to be "intact." As for an update block, when it eventually fills up with update data in logically sequential order, then the update block will become an updated intact metablock that readily replace the original metablock. On the other hand, if the update block fills up with update data in a logically different order from that of the intact block, the update block is a non-sequential or chaotic update block and the out of order segments must be further processed so that eventually the update data of the logical group is stored in the same order as that of the intact block. In the preferred case, it is in logically sequential order in a single metablock. The further processing involves consolidating the updated sectors in the update block with unchanged sectors in the original block into yet another update metablock. The consolidated update block will then be in logically sequential order and can be used to replace the original block. Under some predetermined condition, the consolidation process is preceded by one or more compaction processes. The compaction process simply re-records the sectors of the chaotic update block into a replacing chaotic update block while eliminating any duplicate logical sector that has been rendered obsolete by a subsequent update of the same logical sector.

The update scheme allows for multiple update threads running concurrently, up to a predefined maximum. Each thread is a logical group undergoing updates using its dedicated update metablock. Alternately, a dedicated zone based on a structure of a finer granularity than a metablock can be used.

When data belonging to a logical group is first updated, a metablock is allocated and dedicated as an update block for the update data of the logical group. The update block is allocated when a command is received from the host to write a segment of one or more sectors of the logical group for which an existing metablock has been storing all its sectors intact. For the first host write operation, a first segment of data is recorded on the update block. Since each host write is a segment of one or more sector with contiguous logical address, it follows that the first update is always sequential in nature. In subsequent host writes, update segments within the same logical group are recorded in the update block in the order received from the host. A block continues to be managed as a sequential update block whilst sectors updated by the host within the associated logical group remain logically sequential. All sectors updated in this logical group are written to this sequential update block, until the block is either closed or converted to a chaotic update block.

Figure 7A:
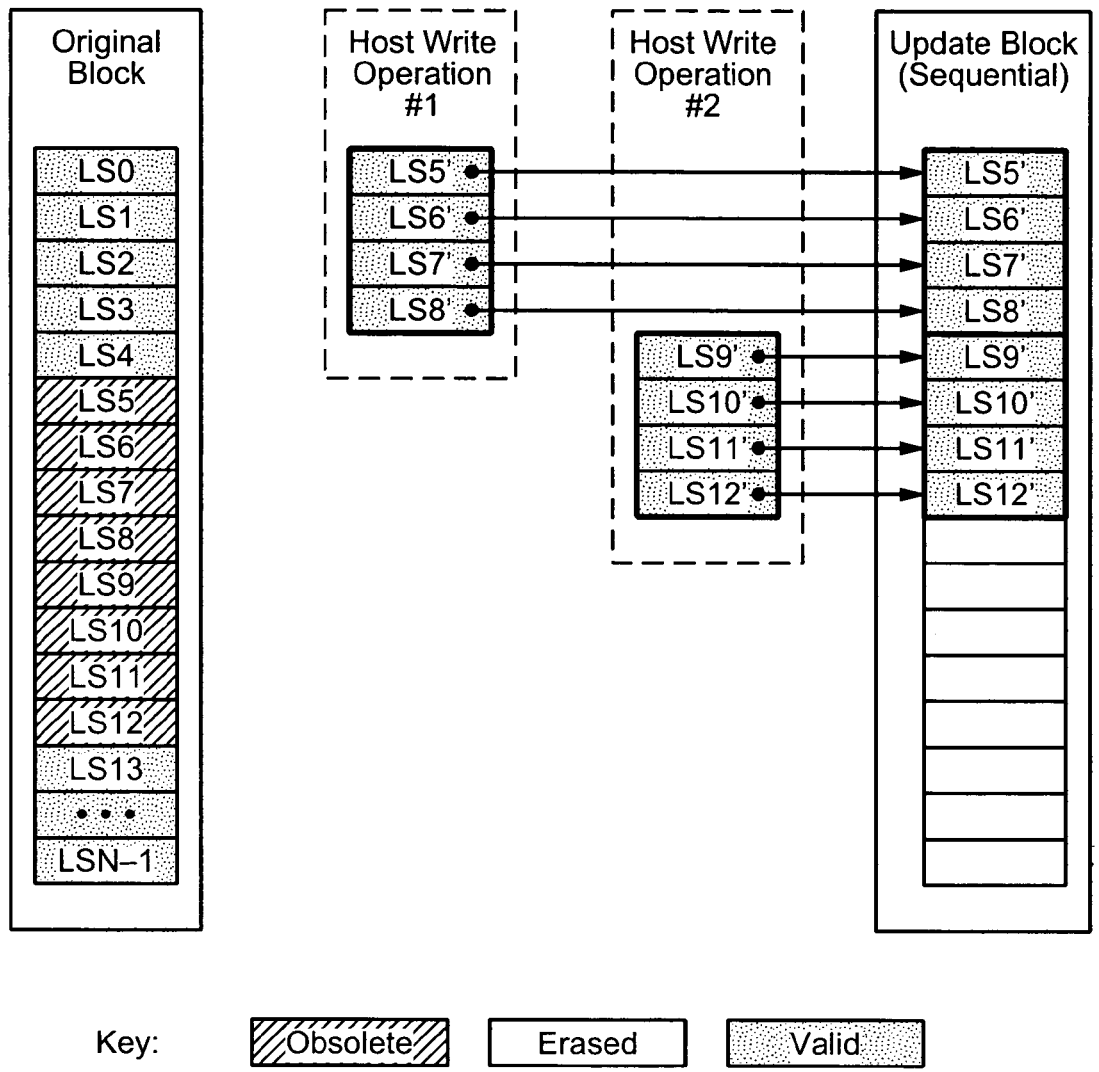
FIG. 7A illustrates an example of sectors in a logical group being written in sequential order to a sequential update block.

FIG. 7A illustrates an example of sectors in a logical group being written in sequential order to a sequential update block as a result of two separate host write operations, whilst the corresponding sectors in the original block for the logical group become obsolete. In host write operation #1, the data in the logical sectors LS5-LS8 are being updated. The updated data as LS5'-LS8' are recorded in a newly allocated dedicated update block.

For expediency, the first sector to be updated in the logical group is recorded in the dedicated update block starting from the first physical sector location. In general, the first logical sector to be updated is not necessarily the logical first sector of the group, and there may therefore be an offset between the start of the logical group and the start of the update block. This offset is known as page tag as described previously in connection with FIG. 3A. Subsequent sectors are updated in logically sequential order. When the last sector of the logical group is written, group addresses wrap around and the write sequence continues with the first sector of the group.

In host write operation #2, the segment of data in the logical sectors LS9-LS12 are being updated. The updated data as LS9'-LS12' are recorded in the dedicated update block in a location directly following where the last write ends. It can be seen that the two host writes are such that the update data has been recorded in the update block in logically sequential order, namely LS5'-LS12'. The update block is regarded as a sequential update block since it has been filled in logically sequential order. The update data recorded in the update block obsoletes the corresponding ones in the original block.

Chaotic update block management may be initiated for an existing sequential update block when any sector updated by the host within the associated logical group is logically non-sequential. A chaotic update block is a form of data update block in which logical sectors within an associated logical group may be updated in any order and with any amount of repetition. It is created by conversion from a sequential update block when a sector written by a host is logically non-sequential to the previously written sector within the logical group being updated. All sectors subsequently updated in this logical group are written in the next available sector location in the chaotic update block, whatever their logical sector address within the group.

Figure 7B:
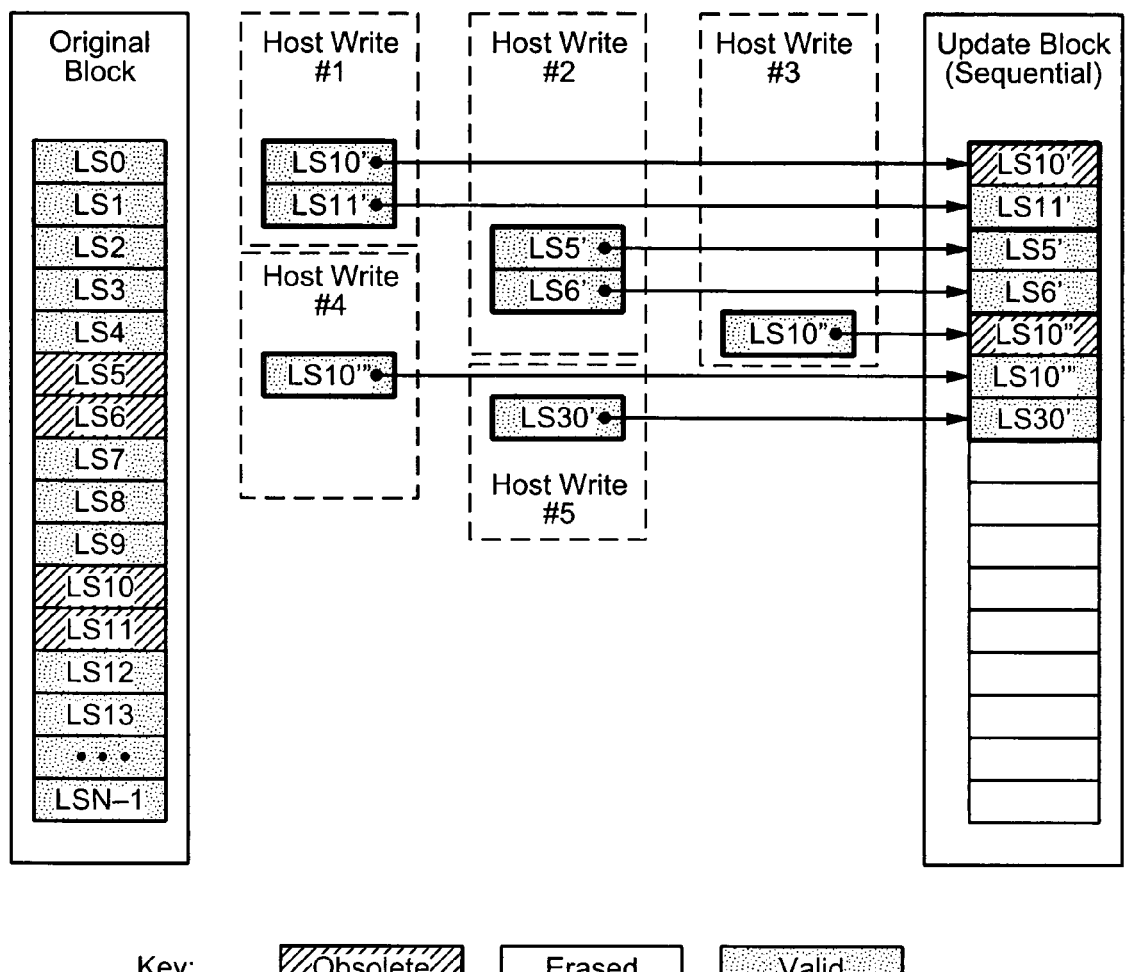
FIG. 7B illustrates an example of sectors in a logical group being written in chaotic order to a chaotic update block.

FIG. 7B illustrates an example of sectors in a logical group being written in chaotic order to a chaotic update block as a result of five separate host write operations, whilst superseded sectors in the original block for the logical group and duplicated sectors in the chaotic update block become obsolete. In host write operation #1, the logical sectors LS10-LS11 of a given logical group stored in an original metablock is updated. The updated logical sectors LS10'-LS11' are stored in a newly allocated update block. At this point, the update block is a sequential one. In host write operation #2, the logical sectors LS5-LS6 are updated as LS5'-LS6' and recorded in the update block in the location immediately following the last write. This converts the update block from a sequential to a chaotic one. In host write operation #3, the logical sector LS10 is being updated again and is recorded in the next location of the update block as LS10". At this point LS10" in the update block supersedes LS10' in a previous recording which in turns supercedes LS10 in the original block. In host write operation #4, the data in the logical sector LS10 is again updated and is recorded in the next location of the update block as LS10'''. Thus, LS10''' is now the latest and only valid data for the logical sector LS10. In host write operation #5, the data in logical sector LS30 is being updated and recorded in the update block as LS30'. Thus, the example illustrates that sectors within a logical group can be written in a chaotic update block in any order and with any repetition.

As several of the exemplary embodiments given below are based on determining "hot" structures based on the chaotic block index (CBI), this structure will be described further in the next few paragraphs. A sequential update block has the data stored in logically sequential order, thus any logical sector among the block can be located easily. A chaotic update block has its logical sectors stored out of order and may also store multiple update generations of a logical sector. Additional information must be maintained to keep track of where each valid logical sector is located in the chaotic update block.

In the preferred embodiment, chaotic block indexing data structures allow tracking and fast access of all valid sectors in a chaotic block. Chaotic block indexing independently manages small regions of logical address space, and efficiently handles system data and hot regions of user data. The indexing data structures essentially allow indexing information to be maintained in flash memory with infrequent update requirement so that performance is not significantly impacted. On the other hand, lists of recently written sectors in chaotic blocks are held in a chaotic sector list in controller RAM. Also, a cache of index information from flash memory is held in controller RAM in order to minimize the number of flash sector accesses for address translation. Indexes for each chaotic block are stored in chaotic block index (CBI) sectors in flash memory.

Figures 8A, 8B:
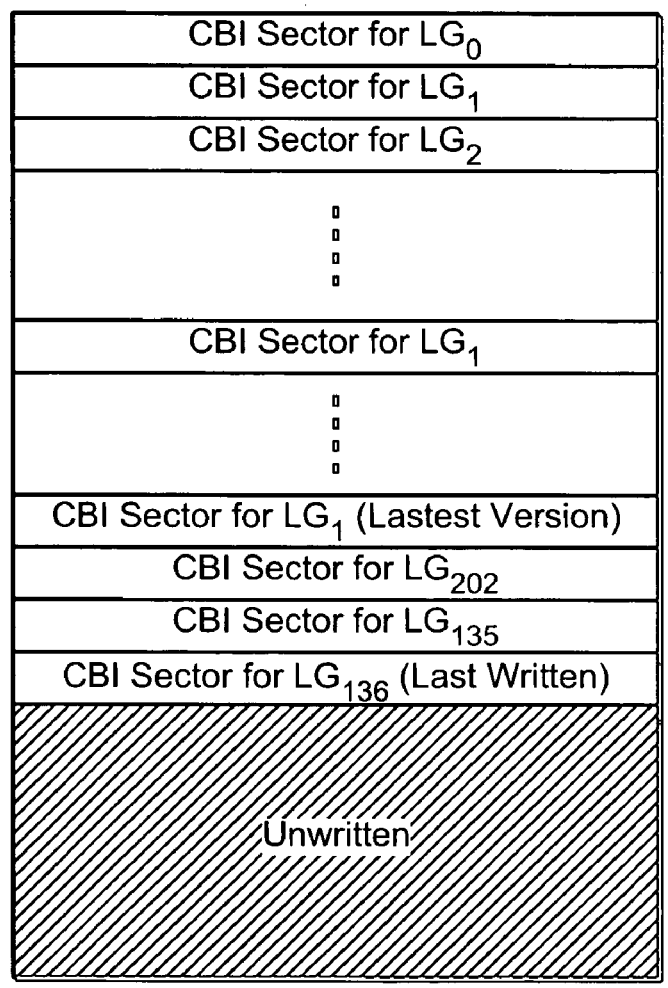
FIG. 8A illustrates the data fields of a chaotic block index (CBI) sector.
FIG. 8B illustrates an example of the chaotic block index (CBI) sectors being recorded in a dedicated metablock.

FIG. 8A illustrates the data fields of a chaotic block index (CBI) sector. A Chaotic Block Index Sector (CBI sector)

contains an index for each sector in a logical group mapped to a chaotic update block, defining the location of each sector of the logical group within the chaotic update block or its associated original block. A CBI sector includes a chaotic block index field for keeping track of valid sectors within the chaotic block, a chaotic block info field for keeping track of address parameters for the chaotic block, and a sector index field for keeping track of the valid CBI sectors within the metablock (CBI block) storing the CBI sectors.

FIG. 8B illustrates an example of the chaotic block index (CBI) sectors being recorded in a dedicated metablock. The dedicated metablock will be referred to as a CBI block 620. When a CBI sector is updated, it is written in the next available physical sector location in the CBI block 620. Multiple copies of a CBI sector may therefore exist in the CBI block, with only the last written copy being valid. For example the CBI sector for the logical group $LG_1$ has been updated three times with the latest version being the valid one. The location of each valid sector in the CBI block is identified by a set of indices in the last written CBI sector in the block. In this example, the last written CBI sector in the block is CBI sector for $LG_{136}$ and its set of indices is the valid one superceding all previous ones. When the CBI block eventually becomes fully filled with CBI sectors, the block is compacted during a control write operation by rewriting all valid sectors to a new block location. The full block is then erased.

The chaotic block index field within a CBI sector contains an index entry for each logical sector within a logical group or sub-group mapped to a chaotic update block. Each index entry signifies an offset within the chaotic update block at which valid data for the corresponding logical sector is located. A reserved index value indicates that no valid data for the logical sector exists in the chaotic update block, and that the corresponding sector in the associated original block is valid. A cache of some chaotic block index field entries is held in controller RAM.

The chaotic block info field within a CBI sector contains one entry for each chaotic update block that exists in the system, recording address parameter information for the block. Information in this field is only valid in the last written sector in the CBI block. This information is also present in data structures in RAM.

The entry for each chaotic update block includes three address parameters. The first is the logical address of the logical group (or logical group number) associated with the chaotic update block. The second is the metablock address of the chaotic update block. The third is the physical address offset of the last sector written in the chaotic update block. The offset information sets the start point for scanning of the chaotic update block during initialization, to rebuild data structures in RAM.

The sector index field contains an entry for each valid CBI sector in the CBI block. It defines the offsets within the CBI block at which the most recently written CBI sectors relating to each permitted chaotic update block are located. A reserved value of an offset in the index indicates that a permitted chaotic update block does not exist.

Figure 8C:
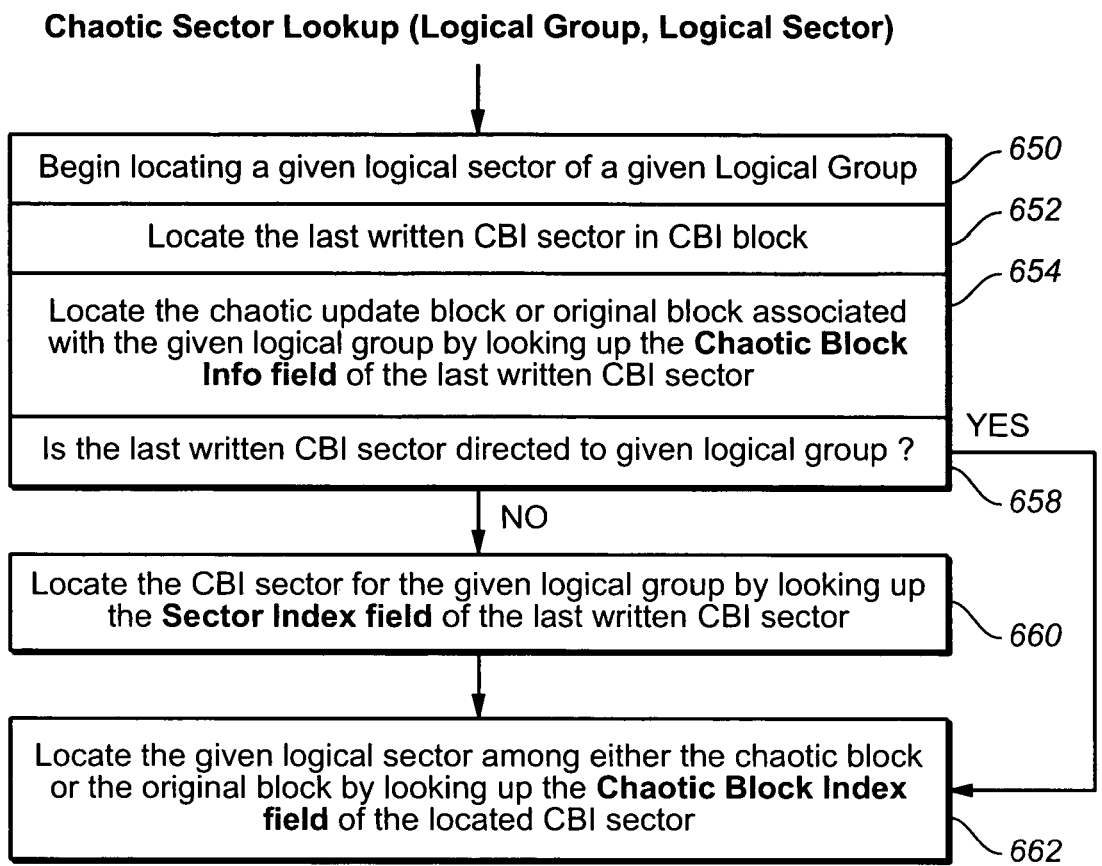
FIG. 8C is a flow diagram illustrating access to the data of a logical sector of a given logical group undergoing chaotic update.

FIG. 8C is a flow diagram illustrating access to the data of a logical sector of a given logical group undergoing chaotic update. During the update process, the update data is recorded in the chaotic update block while the unchanged data remains in the original metablock associated with the logical group. The process of accessing a logical sector of the logical group under chaotic update is as follows:

STEP 650: Begin locating a given logical sector of a given logical group.

STEP 652: Locate last written CBI sector in the CBI block

STEP 654: Locate the chaotic update block or original block associated with the given logical group by looking up the Chaotic Block Info field of the last written CBI sector. This step can be performed any time just before STEP 662.

STEP 658: If the last written CBI sector is directed to the given logical group, the CBI sector is located. Proceed to STEP 662. Otherwise, proceed to STEP 660.

STEP 660: Locate the CBI sector for the given logical group by looking up the sector index field of the last written CBI sector.

STEP 662: Locate the given logical sector among either the chaotic block or the original block by looking up the Chaotic Block Index field of the located CBI sector.

Figure 8D:
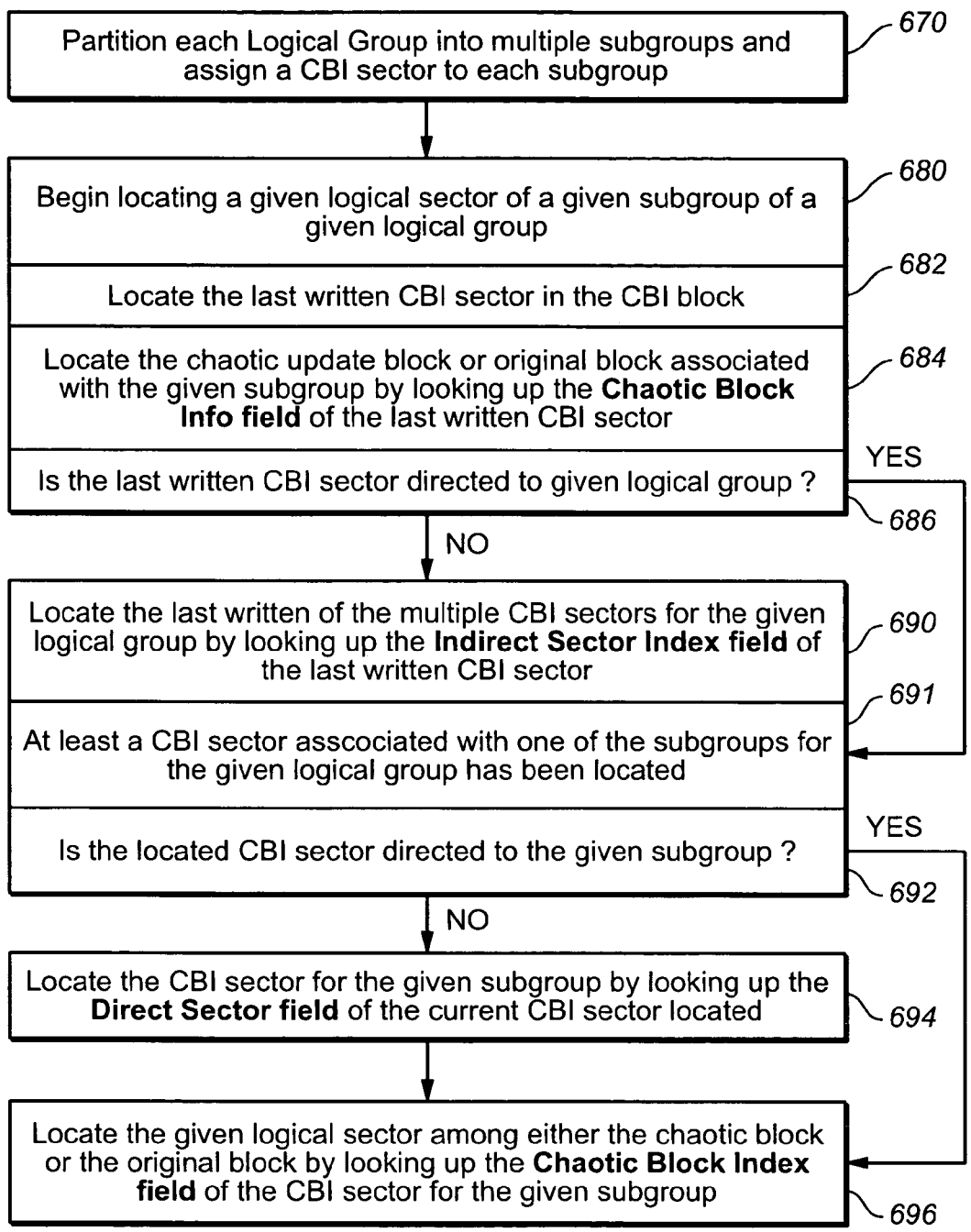
FIG. 8D is a flow diagram illustrating access to the data of a logical sector of a given logical group undergoing chaotic update, according to an alternative embodiment in which logical group has been partitioned into subgroups.

FIG. 8D is a flow diagram illustrating access to the data of a logical sector of a given logical group undergoing chaotic update, according to an alternative embodiment in which logical group has been partitioned into subgroups. The finite capacity of a CBI sector can only keep track of a predetermined maximum number of logical sectors. When the logical group has more logical sectors than a single CBI sector can handle, the logical group is partitioned into multiple subgroups with a CBI sector assigned to each subgroup. In one example, each CBI sector has enough capacity for tracking a logical group consisting of 256 sectors and up to 8 chaotic update blocks. If the logical group has a size exceeding 256 sectors, a separate CBI sector exists for each 256-sector subgroup within the logical group. CBI sectors may exist for up to 8 sub-groups within a logical group, giving support for logical groups up to 2048 sectors in size.

In the preferred embodiment, an indirect indexing scheme is employed to facilitate management of the index. Each entry of the sector index has direct and indirect fields.

The direct sector index defines the offsets within the CBI block at which all possible CBI sectors relating to a specific chaotic update block are located. Information in this field is only valid in the last written CBI sector relating to that specific chaotic update block. A reserved value of an offset in the index indicates that the CBI sector does not exist because the corresponding logical subgroup relating to the chaotic update block either does not exist, or has not been updated since the update block was allocated.

The indirect sector index defines the offsets within the CBI block at which the most recently written CBI sectors relating to each permitted chaotic update block are located. A reserved value of an offset in the index indicates that a permitted chaotic update block does not exist.

FIG. 8D shows the process of accessing a logical sector of the logical group under chaotic update as follows:

STEP 670: Partition each Logical Group into multiple subgroups and assign a CBI sector to each subgroup STEP 680: Begin locating a given logical sector of a given subgroup of a given logical group.

STEP 682: Locate the last written CBI sector in the CBI block.

STEP 684: Locate the chaotic update block or original block associated with the given subgroup by looking up the Chaotic Block Info field of the last written CBI sector. This step can be performed any time just before STEP 696.

STEP 686: If the last written CBI sector is directed to the given logical group, proceed to STEP 691. Otherwise, proceed to STEP 690.

STEP 690: Locate the last written of the multiple CBI sectors for the given logical group by looking up the Indirect Sector Index field of the last written CBI sector.

STEP 691: At least a CBI sector associate with one of the subgroups for the given logical group has been located. Continue.

STEP 692: If the located CBI sector directed to the given subgroup, the CBI sector for the given subgroup is located. Proceed to STEP 696. Otherwise, proceed to STEP 694.

STEP 694: Locate the CBI sector for the given subgroup by looking up the direct sector index field of the currently located CBI sector.

STEP 696: Locate the given logical sector among either the chaotic block or the original block by looking up the Chaotic Block Index field of the CBI sector for the given subgroup.

Figure 8E:
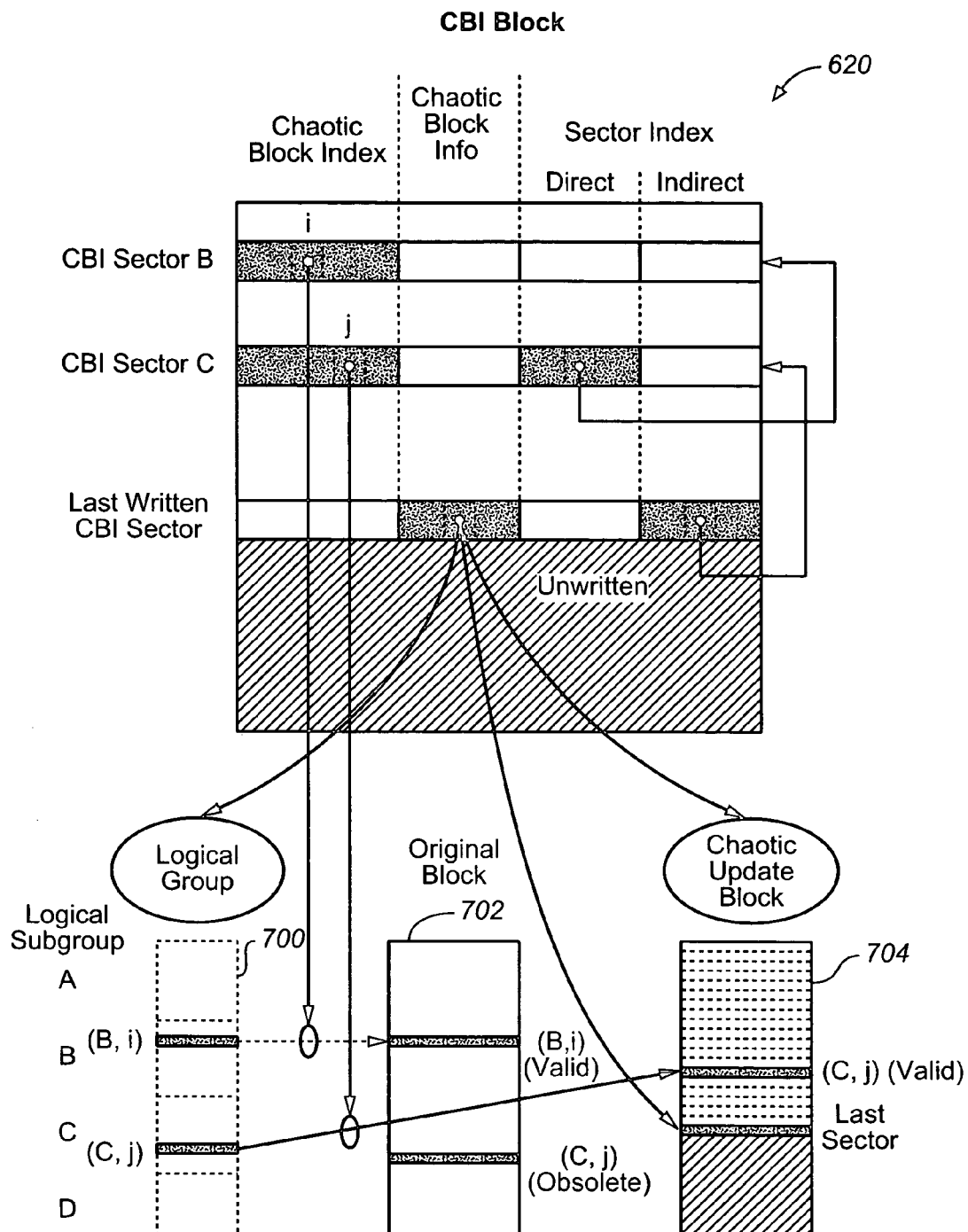
FIG. 8E illustrates examples of Chaotic Block Indexing (CBI) sectors and their functions for the embodiment where each logical group is partitioned into multiple subgroups.

FIG. 8E illustrates examples of Chaotic Block Indexing (CBI) sectors and their functions for the embodiment where each logical group is partitioned into multiple subgroups. A logical group 700 originally has its intact data stored in an original metablock 702. The logical group is then undergoing updates with the allocation of a dedicated chaotic update block 704. In the present examples, the logical group 700 is partitioned into subgroups, such subgroups A, B, C, D, each having 256 sectors.

In order to locate the ith sector in the subgroup B, the last written CBI sector in the CBI block 620 is first located. The chaotic block info field of the last written CBI sector provides the address to locate the chaotic update block 704 for the given logical group. At the same time it provides the location of the last sector written in the chaotic block. This information is useful in the event of scanning and rebuilding indices.

If the last written CBI sector turns out to be one of the four CBI sectors of the given logical group, it will be further determined if it is exactly the CBI sector for the given subgroup B that contains the ith logical sector. If it is, then the CBI sector's chaotic block index will point to the metablock location for storing the data for the ith logical sector. The sector location could be either in the chaotic update block 704 or the original block 702.

If the last written CBI sector turns out to be one of the four CBI sectors of the given logical group but is not exactly for the subgroup B, then its direct sector index is looked up to locate the CBI sector for the subgroup B. Once this exact CBI sector is located, its chaotic block index is looked up to locate the ith logical sector among the chaotic update block 704 and the original block 702.

If the last written CBI sector turns out not to be anyone of the four CBI sectors of the given logical group, its indirect sector index is looked up to locate one of the four. In the example shown in FIG. 8E, the CBI sector for subgroup C is located. Then this CBI sector for subgroup C has its direct sector index looked up to locate the exact CBI sector for the subgroup B. The example shows that when its chaotic block index is looked up, the ith logical sector is found to be unchanged and it valid data will be located in the original block.

Similar consideration applies to locating the jth logical sector in subgroup C of the given logical group. The example shows that the last written CBI sector turns out not to be any one of the four CBI sectors of the given logical group. Its indirect sector index points to one of the four CBI sectors for the given group. The last written of four pointed to also turns out to be exactly the CBI sector for the subgroup C. When its chaotic block index is looked up, the jth logical sector is found to be located at a designated location in the chaotic update block 704.

A list of chaotic sectors exists in controller RAM for each chaotic update block in the system. Each list contains a record of sectors written in the chaotic update block since a related CBI sector was last updated in flash memory. The number of logical sector addresses for a specific chaotic update block, which can be held in a chaotic sector list, is a design parameter with a typical value of 8 to 16. The optimum size of the list is determined as a tradeoff between its effects on overhead for chaotic data-write operations and sector scanning time during initialization.

During system initialization, each chaotic update block is scanned as necessary to identify valid sectors written since the previous update of one of its associated CBI sectors. A chaotic sector list in controller RAM for each chaotic update block is constructed. Each block need only be scanned from the last sector address defined in its chaotic block info field in the last written CBI sector.

When a chaotic update block is allocated, a CBI sector is written to correspond to all updated logical sub-groups. The logical and physical addresses for the chaotic update block are written in an available chaotic block info field in the sector, with null entries in the chaotic block index field. A chaotic sector list is opened in controller RAM.

When a chaotic update block is closed, a CBI sector is written with the logical and physical addresses of the block removed from the chaotic block info field in the sector. The corresponding chaotic sector list in RAM becomes unused.

The corresponding chaotic sector list in controller RAM is modified to include records of sectors written to a chaotic update block. When a chaotic sector list in controller RAM has no available space for records of further sector writes to a chaotic update block, updated CBI sectors are written for logical sub-groups relating to sectors in the list, and the list is cleared.

When the CBI block 620 becomes full, valid CBI sectors are copied to an allocated erased block, and the previous CBI block is erased.

In addition to the more specific embodiments based on the chaotic block indices, other embodiments of the present invention discussed below, such as that at which addresses the memory at the logical group level, use address tables to determine more frequently accessed logical structures. Address tables are used to maintain the correspondence between the logical addresses assigned to data and their physical location within the memory. The logical to physical address translation module 140 shown in FIG. 2 is responsible for relating a host's logical address to a corresponding physical address in flash memory. Mapping between logical groups and physical groups (metablocks) are stored in a set of table and lists distributed among the nonvolatile flash memory 200 and the volatile but more agile RAM 130 (see FIG. 1.) An address table is maintained in flash memory, containing a metablock address for every logical group in the memory system. In addition, logical to physical address records for recently written sectors are temporarily held in RAM. These volatile records can be reconstructed from block lists and data sector headers in flash memory when the system is initialized after power-up. Thus, the address table in flash memory need be updated only infrequently, leading to a low percentage of overhead write operations for control data.

The hierarchy of address records for logical groups includes the open update block list, the closed update block list in RAM and the group address table (GAT) maintained in flash memory.

The open update block list is a list in controller RAM of data update blocks which are currently open for writing updated host sector data. The entry for a block is moved to the closed update block list when the block is closed. The closed update block list is a list in controller RAM of data update blocks which have been closed. A subset of the entries in the list is moved to a sector in the Group Address Table during a control write operation.

The Group Address Table (GAT) is a list of metablock addresses for all logical groups of host data in the memory system. The GAT contains one entry for each logical group, ordered sequentially according to logical address. The nth entry in the GAT contains the metablock address for the logical group with address n. In the preferred embodiment, it is a table in flash memory, comprising a set of sectors (referred to as GAT sectors) with entries defining metablock addresses for every logical group in the memory system. The GAT sectors are located in one or more dedicated control blocks (referred to as GAT blocks) in flash memory.

Figure 9A:
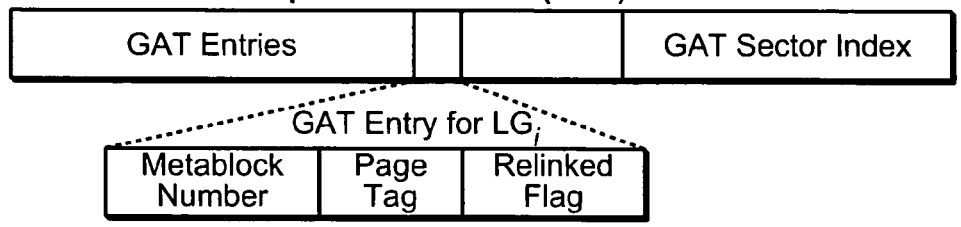
FIG. 9A illustrates the data fields of a group address table (GAT) sector.

FIG. 9A illustrates the data fields of a group address table (GAT) sector. A GAT sector may for example have sufficient capacity to contain GAT entries for a set of 128 contiguous logical groups. Each GAT sector includes two components, namely a set of GAT entries for the metablock address of each logical group within a range, and a GAT sector index. The first component contains information for locating the metablock associated with the logical address. The second component contains information for locating all valid GAT sectors within the GAT block. Each GAT entry has three fields, namely, the metablock number, the page tag as defined earlier in connection with FIG. 3A(iii), and a flag indicating whether the metablock has been relinked. The GAT sector index lists the positions of valid GAT sectors in a GAT block. This index is in every GAT sector but is superceded by the version of the next written GAT sector in the GAT block. Thus only the version in the last written GAT sector is valid.

Figure 9B:
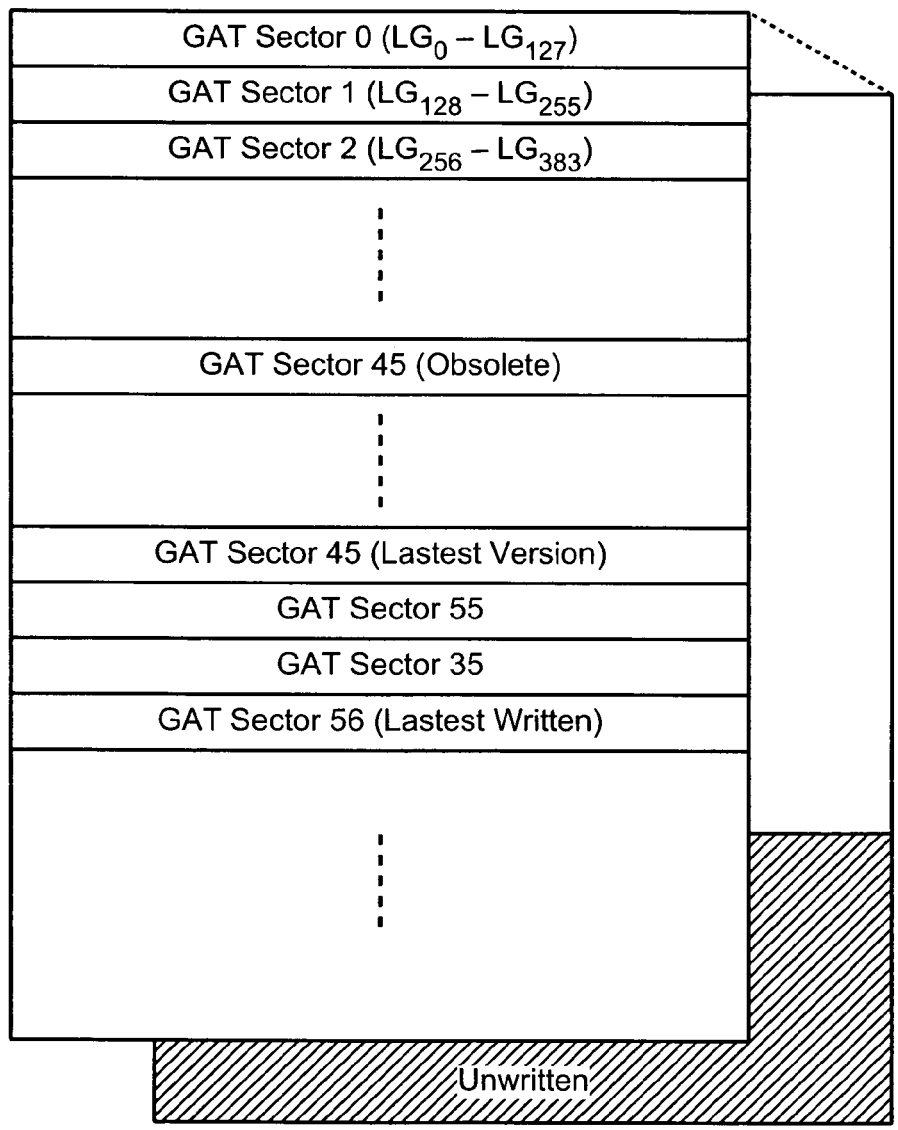
FIG. 9B illustrates an example of the group address table (GAT) sectors being recorded in a GAT block.

FIG. 9B illustrates an example of the group address table (GAT) sectors being recorded in one or more GAT block. A GAT block is a metablock dedicated to recording GAT sectors. When a GAT sector is updated, it is written in the next available physical sector location in the GAT block 720. Multiple copies of a GAT sector may therefore exist in the GAT block, with only the last written copy being valid. For example the GAT sector 45 has been updated at least two times with the latest version being the valid one. The location of each valid sector in the GAT block is identified by a set of indices in the last written GAT sector in the block. In this example, the last written GAT sector in the block is GAT sector 56 and its set of indices is the valid one superceding all previous ones. When the GAT block eventually becomes fully filled with GAT sectors, the block is compacted during a control write operation by rewriting all valid sectors to a new block location. The full block is then erased.

As described earlier, a GAT block contains entries for a logically contiguous set of groups in a region of logical address space. GAT sectors within a GAT block each contain logical to physical mapping information for 128 contiguous logical groups. The number of GAT sectors required to store entries for all logical groups within the address range spanned by a GAT block occupy only a fraction of the total sector positions in the block. A GAT sector may therefore be updated by writing it at the next available sector position in the block. An index of all valid GAT sectors and their position in the GAT block is maintained in an index field in the most recently written GAT sector. The fraction of the total sectors in a GAT block occupied by valid GAT sectors is a system design parameter, which is typically 25%. However, there is a maximum of 64 valid GAT sectors per GAT block. In systems with large logical capacity, it may be necessary to store GAT sectors in more than one GAT block. In this case, each GAT block is associated with a fixed range of logical groups.

A GAT update is performed as part of a control write operation, which is triggered when the ABL runs out of blocks for allocation (see FIG. 18.) It is performed concurrently with ABL fill and CBL empty operations. During a GAT update operation, one GAT sector has entries updated with information from corresponding entries in the closed update block list. When a GAT entry is updated, any corresponding entries are removed from the closed update block list (CUBL). For example, the GAT sector to be updated is selected on the basis of the first entry in the closed update block list. The updated sector is written to the next available sector location in the GAT block.

A GAT rewrite operation occurs during a control write operation when no sector location is available for an updated GAT sector. A new GAT block is allocated, and valid GAT sectors as defined by the GAT index are copied in sequential order from the full GAT block. The full GAT block is then erased.

A GAT cache is a copy in controller RAM 130 of entries in a subdivision of the 128 entries in a GAT sector. The number of GAT cache entries is a system design parameter, with typical value 32. A GAT cache for the relevant sector subdivision is created each time an entry is read from a GAT sector. Multiple GAT caches are maintained. The number is a design parameter with a typical value of 4. A GAT cache is overwritten with entries for a different sector subdivision on a least-recently-used basis.

The use of adaptive metablocks is presented in U.S. patent application Ser. No. 10/749,189, which describes the usage of smaller blocks for frequently updated hot zones. More specifically, in a memory system having multiple erase blocks in multiple planes, a selected number of erase blocks are programmed together as an adaptive metablock. The number of erase blocks in an adaptive metablock is chosen according to the data to be programmed. Logical address space is divided into logical groups, a logical group having the same size as one erase block. Adaptive logical blocks are formed from logical groups. One adaptive logical block is stored in one adaptive metablock. This application describes the use of differing management methods in the memory, but not an adaptive and dynamic methods for changing portions from a standard, metablock based management technique to an alternate management regime and changing back. This is presented in the following section.

Adaptive and Floating Data Structures

As described in the above discussion and in the references cited therein, to improve performance through increased parallelism, blocks from multiple arrays, or "planes", are linked together into "meta-blocks" which are then operated as the basic unit. When a host accesses a small logical area, such as a sector or a collection of a small number of sectors, of the card repeatedly and the size, number and location of those small logical areas are not predictable, the controller is faced with a large amount of data relocation, or "garbage collection", and long access time latencies. A principle aspect of the present invention is for the controller to determine and manage these more frequently accessed smaller logical structures to reduce these shortcomings while maintaining the advantages of using large data structures for large logically contiguous data structures.

More details on the process of linking blocks into meta-blocks and various aspects of garbage collection are described, respectively, in U.S. patent application Ser. Nos. 10/750,157 and 10/846,289, both of which are hereby incorporated by reference. Various techniques for handling the smaller data portions can be found, for example, in U.S. patent application Ser. No. 10/749,189. The principle concern here is their detection and maintenance.

The exemplary embodiments will be described primarily based on the address table structure and chaotic block indices presented above and developed more fully in U.S. patent application Ser. No. 10/750,155.

Other memory structures, such as systems using cyclic storage algorithms, such as described in International patent document WO 03/027828, may support a System Blocks in which the address translation information is maintained. As developed in more detail in International patent document WO 03/027828, this system area can be used to store sectors that are expected to be written more frequently. However, this arrangement was predefined in size and location and not efficient for multiple "hot" segments, repeatedly written by the host, located inside or outside the fixed system zone. Further, it did not allow for dynamic updating as new logical addresses become "hot" and previous active logical addresses cool down.

The present invention improves upon these methods and other prior art methods by monitoring the pattern of host access by checking the sectors' update history and control data structures' update history. This can significantly reduce the massive garbage collection (data relocation) that results when such sectors are normally stored in logically contiguous groups. When repeated access patterns are detected and then expected again, the "hot" segments are separated into specially handled data structures having a sector management that differs from standard contiguous logical groups and is optimized for the repeated host accesses in order to reduce the frequency and amount of garbage collection operations. The non-standard data structures can subsequently be reassigned back into normal logical group form. When new "hot" areas appear new non-standard structures are organized. The logical location and size of the non-standard structures can closely match that of the "hot" segments. In this way, this solves the problem, found in these earlier arrangements, that if the system does not have enough resources to handle true "hot" zones as well as those which are "hot" for only for a relatively short term, the short term ones can trigger excessive garbage collection of the special blocks used for the long term ones. The volume of spare capacity on the card may limit the number of such non-standard structures, as these structures tend to be less compact than the logically grouped data blocks. These non-standard structures can result from sectors holding user data as well as system data, although the situation typically results more frequently from system data, such as address tables (the GAT structure, for example), which are updated more often. U.S. Ser. No. 10/917,867 filed Aug. 13, 2004 In the following discussion, logical sector will refer the basic data structure by which the host transfers data, with a physical sector being a portion of the memory that can hold the amount of data in a logical sector and, typically, associated overhead data. A block is the unit of erase in non-volatile memories, such as flash memories, that erase in bulk prior to having new data programmed into them. Depending on the architecture, a block may range in size from one to a large number of sectors. A meta-block is group of several linked blocks, typically from several semi-autonomous arrays (or "planes") distributed across one or more chips. The unit of read and write to the memory array is a page and usually consists of one or more sectors. (The read page is taken to be the same size as the write page below, although this need not be the case in more general arrangements.)

As a first exemplary embodiment, the detection of a "hot" logical group bases on an analysis of a logical to physical address table, specifically the GAT described above with respect to FIGS. 9A and 9B. The first step of the GAT analysis is to find frequently updated GAT sectors, which can be detected by analyzing the GAT block. Since if a GAT block has been recently re-written and compacted the history is lost, it may be difficult to find out the update frequency, the most accurate detection can be made when GAT block is nearly full. In this case, most of the block contains old, obsolete GAT sectors that represent the update pattern. For example, in FIG. 9B, if GAT sector 56 has been rewritten much time, it would be a "hot" sector that could be taken out of the standard management regime and handled differently.

Subsequently, within the frequently updated GAT sector, entries which are updated relatively more often will point out the corresponding Logical groups that are "hot". FIG. 9A shows the structure of a GAT sector, which has 128 entries. By comparing different versions of the same GAT sector it is possible to determine which entries are changed often. Typically, the number of GAT entries updated at the same time is often very low.

The determination to use a non-standard format (also referred to alternately as "disorganized", "sporadic", or even "chaotic" formats) can be based on one or more of a number of criteria. For example, the history of sector writes based on GAT Block 720 as already described can be used. For example, if the same GAT page is frequently rewritten, a block could be allocated for its use. The determination could also be based on a sectors "temperature", such as its number of erases (the "hot count" or "experience count"). This feature can be restricted to a particular area, such as those containing system data, as this tends to be more frequently updated, or allowed for the memory as a whole.

Returning to FIG. 1, the present invention can be implemented using a hardware architecture of controller 100 in which firmware of the memory system 20 provides the determination and management capabilities. The firmware is instruction code for the microprocessor and is normally stored in one of the memories (ROM 122, RAM 130, Flash 200, or other non-volatile memory as described further below). As is familiar in the art, various combinations of software, hardware, or firmware can equivalently carry out such firmware functions. In alternate embodiments, the memory system 20 may be embedded in the host 10, or, as is the case with SmartMedia or xD cards, the controller 100 is embedded, but the memory portion 200 is removable.

Unlike the standard organization based upon logically contiguous sectors, which is retained for the logical addresses which are not disproportionately accessed, the adaptive zones of the memory can be logically or physically organized based upon single sector (or other small group) optimized management. Examples are given in U.S. patent application U.S. patent application incorporated by reference above. The non-standard zone may use a different physically parallelism (for example, blocks may not linked into meta-blocks), may use different data write sequences, and may be less compact than the standard large logical group structure. As these non-standard zones are likely less compact, the number of such zones can be limited by the number of spare blocks available.

As described above, the exemplary embodiment performs the logical to physical address translation based upon Group Address Table (GAT) in the Flash Memory 200. The decision to organize an adaptive non-standard zone can be based on monitoring these structures. For example, when relocating a GAT block, the number of rewrites of every page within the block can be checked, where in one embodiment a count is used instead of block scanning. If a "hot" page is identified, than the typically smaller "hot" zone within the page is determined. If it is confirmed that there is a particularly "hot" block or meta-block being subjected to repetitive rewrites, the "hot" sectors could be identified by a "temperature" information maintained for every sector or small group of sectors.

The same sort of process can be performed upon the logical to physical address translation (140, FIG. 2). However, as this is maintained in volatile memory, this information would be lost each time the memory system is shut down. One method to avoid this problem is to maintain a history for the sector address record in non-volatile memory or in a special control structure. Another alternative is to use an alternate non-volatile memory to maintain the sector address record. Such memories employing both flash and a second form of non-volatile memory are described in U.S. patent application Ser. No. 10/841,379 filed May 7, 2004, which is hereby incorporated by reference, and this aspect of the present invention is one example of the use of such memories.

The temperature parameter need not be absolute, such as using the last time stamp to check how recently the sector was written, but balanced with the number of sector address record entries (the number of contiguous data blocks). The temperature parameter could also be a statistical approach using the difference between time stamps for some number of the last sector writes.

Alternately, the GAT can itself store the range of logical groups updated since the last write, or last several writes. Logical group headers can also contain the same, or sectors written by the host can be marked as they are relocated.

In one set of embodiments, to determine a "hot" sector or group of sectors, the GAT (or other address table) can be searched to determine the large logical structure, for example the logical structure corresponding to a meta-block, with which the controller works in order to determine where any "hot" regions are contained. The larger logical structure can then be searched at the sector level. The determination at the different levels of logical address granularity can be based upon control/used data update history, the history of host writes, or "temperature parameters" for the data structures.

A number of other exemplary embodiments can also be based on the chaotic block structure described above with respect to FIGS. 8A-8E. In a first of these, the detection of a 'hot' logical group or subgroup (FIG. 8E) is based on analysis of the CBI block (FIG. 8B). If the CBI block contains CBI sectors that cover less than a full Chaotic block, then a more frequently updated CBI sector would mean that the corresponding logical sub-group is frequently updated or 'hot'. In this case, special measures such as allocation of a Chaotic block can be taken for the sub-group(s) rather than a bigger logical group. This method is applicable to full size logical group detection only in the cases when a single CBI sector covers whole Chaotic block or multiple Chaotic blocks.

Another embodiment detects smaller group of "hot" sectors based on CBI analysis. This is a method of finding a small group of sectors that are frequently updated in the Chaotic block. The CBI sectors contain entries for individual sectors or small groups of sectors (often pages or meta-pages). If a CBI block has several old records of the same CBI sector, they can be compared to each other, allowing those entries that have changed to be found. The corresponding group(s) of sectors, which are "hot", can then be handled more efficiently.

In yet another embodiment, the detection of a smaller group of "hot" sectors can be based on chaotic block analysis. This is similar to the preceding embodiment, but now the analysis is based on the update pattern by scanning data in the Chaotic block itself rather than scanning the records about Chaotic block updated. This provides the most precise information, since CBI updates are not done as often as data updates.

A number of other embodiments are, of course, possible. For example, a group of "hot" sectors can be detected based directly on analysis of command access patterns. Such methods are improved if they can account for frequent power cycles, especially in hosts that remove power after almost every command.

It should be noted that the chaotic block handling in patent application Ser. No. 10/750,155 allocates chaotic blocks for the logical groups which are currently frequently and chaotically (non-sequentially updated). This handling is fairly efficient in most cases; however, when the number of "hot" areas is greater than the maximum number of "special" blocks or, in general, available resources to handle them, the various aspects of the present invention can improve system operations. Here, the invention starts to optimize by detecting real, longer term, more established "hot" zones and prevent the short term "hot" zone from taking the special resources, as this means excessive garbage collections. In the primary embodiment of patent application Ser. No. 10/750,155, a single non-sequential update triggers conversion of a Sequential Update block to Chaotic Update block, which triggers closure, garbage collection of the existing Chaotic block.

Figure 10:
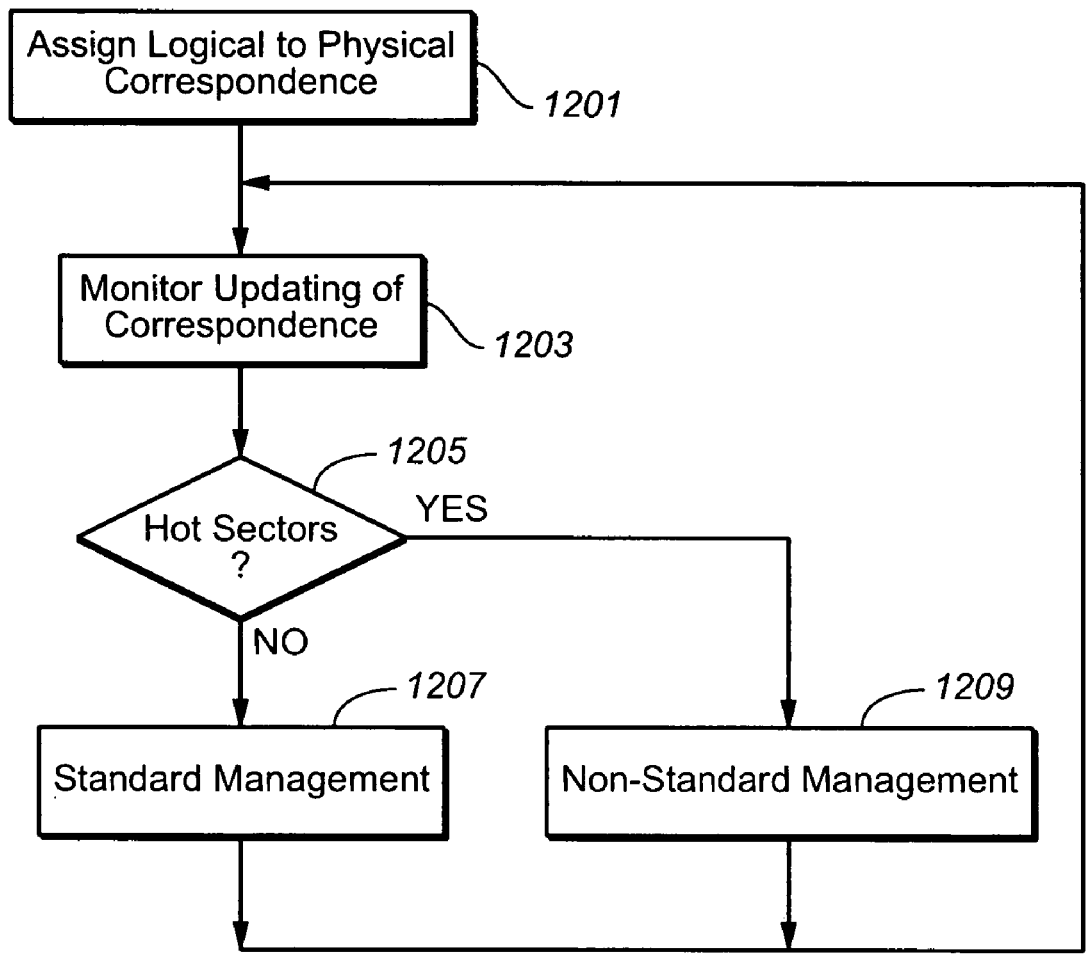
FIG. 10 is a simplified flowchart of a main aspect of the present invention.

FIG. 10 is a flowchart outlining the basic concepts of the present invention. At step 1201, as initial logical-to-physical correspondence is assigned. As data is rewritten and the correspondence updated, the microprocessor 24 uses firmware 25 to monitor the updating in step 1203 based on the access tables or other techniques described herein. As long as the logic determines that no logical areas are particularly "hot" (NO, step 1205), the memory in managed in the standard way (1207). When a relatively "hot" area is determined (YES, step 1205), the controller designates it for the one of the non-standard techniques that are an aspect of the present invention (1209). As operation continues, the memory continues to be monitored (1203) and as sectors become "hot"—or formerly "hot" sectors cease to be so active—as determined at 1205, their current management scene is either maintained or changed. By adjusting the management of the memory according to the usage pattern, managing "hot" areas by different methods, the memory avoids excessive garbage collection. Using special management methods for truly "hot" zones and standard methods for the rest, the garbage collection routines for these two types of areas are decoupled and the frequent rewriting of the "hot" zones will not trigger garbage collections of the standard areas. This saves excessive rewriting of entire metablocks and more efficiently uses the memory's resources.

The present invention allows for the organization of a fast read/write/relocate block format for a system data, which is repeatedly written by the host and can be very small. This is suitable for multi-sector per page flash memories with no or limited ability to do multiple writes to the same page. In a particular embodiment, the non-standard zone, which can occupy a partial block, a whole block, or several blocks, can be split into two parts, a compacted logical group and "free-style" area.

For the portion in a compacted logical group format, a logically contiguous group of sectors can be written contiguously across several planes or chips in a virtual block. The group can be subdivided into logical pages containing a number of sectors, which, for practical implementation, is preferably the same size as a physical page.

The non-standard, or "free-style" zone, can be the rest of the virtual block or a separate block or group of blocks. Every physical page, which may span across several planes or chips, can be fully or partially written by new copies (or current valid copies, some written by the host, some already in the flash memory) of sectors belonging to one of the logical pages of the logical group. The sectors within non-standard zone preferable retain the arrangement of having a header as well as the data area. If the physical page spans multiple planes, the sector data area would contain either sector data or a pointer to the valid copy of the sector which is supposed to be there, but which is missing from the logical page, according to the plane. In particular embodiments, all the zone sectors are written with in the same plane. The sector header area would contain pointers to the physical pages that contain at least one, but the latest written, sector of one or more logical pages of the same logical group. In this arrangement, the most recently written physical page contains pointers to all other physical pages containing valid sector copies, pointers to valid sector copies, or both. This would be similar to techniques described in U.S. patent application Ser. No. 10/917,867 that was incorporated by reference above. In particular, in the section entitled "Information About Recently Written Sectors Stored in Data Sector Header in Chaotic Update Block", the storage of a data portion pointer in a header area of a data portion is described there with respect to FIGS. 39A and, particularly, 39B. Although described there for control data and not being limited to a single plane, these techniques could be readily adapted to the present case.

The non-standard zone can be managed in a number of different ways. In one set of embodiments, an entire block is allocated for the non-logically contiguous set of sectors type and/or sequence of writes. When the block, or a particular plane within the block, becomes full, a data relocation (or garbage collection) is performed to merge valid copies from the previous block (or other logical structure) with the newer non-standard block into a new, standard block based on logically contiguous sectors. This new, standard block can then be treated as the other standard areas, continuing to be managed in the standard way if it no longer contains any "hot" area, or with the "hot" areas reverting back to non-standard management if they remain disproportionately active.

In another set of embodiments, the system detects the frequent update of a logical sector, logical group, or other logical structure that becomes the non-standard area, which can be called the "sector group" in this example, by analogy with the non-adaptive "system zones" of International patent document WO 03/027828, incorporated above. The use of adaptive "system zones" can be used to either replace or complement the non-adaptive arrangement described there. The choice of the sector group size depends on the system architecture/configuration and the nature of host activity and can be a function of a physical/virtual block size, host cluster size, or size of hot area of host writes. Thus it can be a predefined size by system, or chosen to match the activity. The controller allocates the "sector group" to a special virtual/physical block. This is preferably uses a logically contiguous structure, but in some cases there may be reasons to split the group into interleaved subgroups, although these may also maintain some or all of the multi-plane parallelism. The "sector group" is then written at the beginning of the block in compact logically order, with the rest of the block written in the sort of "free-style" form described above based on a time and/or history defined order. The "free-style" area can just have entries written according to a simple time order of sector host writes, or can use an interleaved method where the writes are in time order but separately maintained for every plane/chip if there is a plane/chip parallelism. Although it may require more space, the interleaved method has the advantage that it can be compacted more quickly and simply due to maintaining the parallelism of the planes. When the block is full, the valid copies from the "compact" and the "free-style" part of the block into are merged into a new copy of compact "sector group" at the beginning of another available block (if the host is still active in this "hot" area, for example) or back to normal logical group in the case when maintaining of the non-standard block for this area is no longer needed. The non-standard areas can be indicated by a flag in the access table or in the sectors' header.

Generalizations

Various modifications may be made to the arrangement as hereinbefore described without departing from the scope of the invention. For example, a system which incorporates a flash disk device may be physically partitioned in several ways, according to the system architecture, however, all systems generally conform to the structure described herein before. For example, the flash memory 200 is shown in FIG. 1 as being part of a memory system 20, however, it may alternatively be on a removable card and may connect to a host system via a logical interface which as before conforms to industry standard protocols. Examples of such industry standards being PCMCIA ATA, CompactFlash and MultiMediaCard. In such an arrangement the controller may be on a removable card in which case the controller is typically a singe integrated circuit. The Flash memory 200 may consist of one or more integrated circuits and the controller may be integrated on the same integrated circuit as the Flash memory.

It could also be the case that the host and the flash system may be physically partitioned such that only the Flash memory is on a removable card, which has a physical interface to the host system. An example of such a removable Flash memory card is SmartMedia. The controller is located within the host system and may take the form of an integrated circuit, or of firmware which is executed by a processor within the host system.

Alternatively the method of the present invention may be implemented in an embedded memory system that is not physically removable from a host system. Such a system may have the same partitioning as is used for a memory system on a removable card, with the controller being in the form of an integrated circuit and with a logical interface conforming to industry standard protocols. However, the controller may also be integrated with other functions within the host system.

In the arrangement described, each sector is identified by a LBA, however, it may also be identified by an address in the Cylinder/Head/Sector (CHS) format originally used with magnetic disk devices. Also in the described arrangement the controller hardware is dedicated architecture in a separate integrated circuit, however, elements of the controller hardware, such as the microprocessor, may be shared with other functions within the host system. Additionally, the cyclic storage management algorithm may be implemented in a microprocessor within the host system or the process may be performed via standard microprocessor input/output ports without any dedicated controller hardware. If the controller is part of an embedded memory system and shares its microprocessor with other functions of a host system, the logical interface for the control of the memory system may be implemented directly within firmware executed by the processor, this means that hardware registers may be eliminated and variables may be passed directly to a controller function which may be called a host function within the firmware code.

In the flash memory system described previously, data transfer between the host or flash interfaces and the SRAM are performed by DMA however in an alternative embodiment a separate memory block could be used exclusively for buffering sector data. Typically this memory block could be a dual port RAM, with ports allocating independent access by the host interface control block and the flash interface control block.

In the described arrangement the memory blocks into which the memory sectors were arranged were described as being a physical structure within the flash memory comprising 16 sector locations, however it is also possible that these memory blocks comprise 32 flash locations. Also the memory blocks can alternatively be virtual blocks comprising physical blocks distributed across multiple flash chips or multiple independent arrays within the same chip which are erased in a single operation by the controller. Where a virtual block comprises M physical blocks, each with capacity for N sectors, the virtual block has capacity for M*N sectors. A virtual block is treated in exactly the same way as a physical block by the cyclic storage media management algorithms.

It should also be noted that the ROM and expansion port of the controller of the memory system are optional features and need not be included.

Furthermore, each array in the flash memory is described previously as being a complete flash chip, however, it is also the case that each array may be a constituent part of a chip, as some Flash chips such as some 512 Mbit NAND flash designs incorporate multiple arrays within a chip and separate sector program operations may be independently started in different arrays within the chip. Also in the description, pages within the flash array have been described as being equivalent to a sector, however in some AND flash memory chips a page may comprise four sectors and have a capacity of 2112 bytes, in each case the page is programmed in a single operation. Additionally each group of sector data has been described as being the first four sector data of a file, however it may alternatively be a file fragment. Also the host system can write data to the memory system in units of a cluster wherein each cluster will be treated as the controller as an integral number of groups, as opposed to the data being written to the memory system as single sectors.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

As mentioned above, although the discussion so far has referred mainly to embodiments using a charge storing device, such as floating gate EEPROM or FLASH cells, for the memory device, it can be applied to other embodiments, including magnetic and optical media. As the particulars of how the storage elements are read, are written, and store data do not enter into the main aspects of the present invention, the various aspects of the present invention may be applied to other memory types, including, but not limited to, sub 0.1 um transistors, single electron transistors, organic/carbon based nano-transistors, and molecular transistors. For example, NROM and MNOS cells, such as those respectively described in U.S. Pat. No. 5,768,192 of Eitan and U.S. Pat. No. 4,630,086 of Sato et al., or magnetic RAM and FRAM cells, such as those respectively described in U.S. Pat. No. 5,991,193 of Gallagher et al. and U.S. Pat. No. 5,892,706 of Shimizu et al., all of which are hereby incorporated herein by this reference, could also be used. The discussion of alternate non-volatile memories and their uses are developed further in U.S. patent application Ser. No. 10/841,379 filed May 7, 2004, which is hereby incorporated herein by this reference Although the invention has been described with respect to various exemplary embodiments, it will be understood that the invention is entitled to protection within the full scope of the appended claims.

It is claimed:

1. A memory system for connection to a host processor wherein data is identified by a logical address, the system comprising:
    a non-volatile memory circuit for storing user and system data, comprising a plurality of physical sectors, each having multiple memory cells, that are individually addressable by a physical address and structured into multi-sector physical blocks that are the physical unit of erase; and
    a controller circuit that controls accessing of the memory circuit by the host processor for the writing of data structures thereto and reading data structures therefrom, wherein the controller is configured to manage the allocation of physical addresses to logical addresses and the storage of data identified by the logical addresses in the physical areas corresponding to the allocated physical addresses, wherein the controller includes:
        logic circuitry that adjusts the management method of said logical addresses according to the frequency of updating of the allocation of said logical addresses to said physical addresses, managing the more frequently updated logical addresses according to a second method that is different than a first method by which other ones of the logical addresses are managed, wherein the first method manages logical addresses using logically contiguous multi-block data structures and the second method manages logical addresses on a sector level basis.

2. The memory system of claim 1, wherein said logic is implemented in the controller through a firmware implementation.

3. The memory system of claim 1, wherein said logic determines logical addresses whose content is updated relatively more frequently than others of the logical addresses and, in response thereto, assigns the logical address whose content is more frequently updated to a set of said logical addresses managed by the second method.

4. The memory system of claim 3, wherein second method manages the logical addresses optimized according to the access pattern of said more frequently updated logical addresses.

5. The memory system of claim 1 wherein said non-volatile memory comprises a plurality of arrays that are independently readable and writable, and wherein in the first method the controller organizes the logical sectors into larger structures composed of a plurality of sectors operated in parallel and extending across a plurality of said arrays.

6. The memory system of claim 5, wherein said arrays are distributed across multiple chips.

7. The memory system of claim 1, wherein said controller determines those logical addresses whose content is more frequently updated based on the history of sector writes.

8. The memory system of claim 7, wherein said controller maintains said allocation of physical addresses to logical addresses in an allocation table structure and the history of sectors writes is determined from said allocation table structure.

9. The memory system of claim 8, wherein said controller maintains a version of said allocation table structure in the non-volatile memory.

10. The memory system of claim 1, wherein said logic can update the assignment of sectors to be managed according to said first and second methods.

* * * * *

UNITED STATES PATENT AND TRADEMARK OFFICE
CERTIFICATE OF CORRECTION

PATENT NO. : 7,631,162 B2  Page 1 of 1
APPLICATION NO. : 11/261150
DATED : December 8, 2009
INVENTOR(S) : Sergey Anatolievich Gorobets It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 124 days.

Signed and Sealed this

Twenty-first Day of December, 2010

David J. Kappos
*Director of the United States Patent and Trademark Office*